United States Patent
Han et al.

(10) Patent No.: US 8,859,194 B2
(45) Date of Patent: Oct. 14, 2014

(54) POLYMER COMPOUND, AND RESIST-PROTECTING FILM COMPOSITION INCLUDING SAME FOR A LIQUID IMMERSION EXPOSURE PROCESS

(71) Applicants: Man Ho Han, Incheon (KR); Jong Kyoung Park, Incheon (KR); Hyun Jin Kim, Incheon (KR); Jae Hyun Kim, Incheon (KR)

(72) Inventors: Man Ho Han, Incheon (KR); Jong Kyoung Park, Incheon (KR); Hyun Jin Kim, Incheon (KR); Jae Hyun Kim, Incheon (KR)

(73) Assignee: Dongjin Semichem Co., Ltd. (KR)

( * ) Notice: Subject to any disclaimer, the term of this patent is extended or adjusted under 35 U.S.C. 154(b) by 0 days.

(21) Appl. No.: 13/897,014

(22) Filed: May 17, 2013

(65) Prior Publication Data

US 2013/0252170 A1  Sep. 26, 2013

Related U.S. Application Data

(63) Continuation of application No. PCT/KR2011/007655, filed on Oct. 14, 2011.

(30) Foreign Application Priority Data

Nov. 17, 2010 (KR) .................. 10-2010-0114558
Mar. 18, 2011 (KR) .................. 10-2011-0024347

(51) Int. Cl.

| G03F 7/20 | (2006.01) |
|---|---|
| G03F 7/11 | (2006.01) |
| C09D 135/00 | (2006.01) |
| C09D 145/00 | (2006.01) |
| C08F 22/06 | (2006.01) |
| C09D 133/10 | (2006.01) |
| C08F 32/00 | (2006.01) |
| C08L 45/00 | (2006.01) |

(52) U.S. Cl.
CPC ............... *G03F 7/11* (2013.01); *C09D 135/00* (2013.01); *C09D 145/00* (2013.01); *C08F 22/06* (2013.01); *C09D 133/10* (2013.01); *C08F 32/00* (2013.01); *C08L 45/00* (2013.01)
USPC .................. 430/327; 526/245; 430/273.1

(58) Field of Classification Search
None
See application file for complete search history.

(56) References Cited

U.S. PATENT DOCUMENTS

| 6,369,143 B1 * | 4/2002 | Park et al. ................. 524/157 |
| 7,022,458 B2 * | 4/2006 | Lee et al. .................. 430/270.1 |
| 7,288,362 B2 | 10/2007 | Allen et al. |
| 7,569,326 B2 * | 8/2009 | Ohsawa et al. ............ 430/270.1 |
| 8,057,985 B2 * | 11/2011 | Ohashi et al. .............. 430/270.1 |
| 8,105,748 B2 * | 1/2012 | Ohashi et al. .............. 430/270.1 |
| 2005/0277059 A1 * | 12/2005 | Kanda ......................... 430/270.1 |
| 2009/0208867 A1 * | 8/2009 | Harada et al. .............. 430/271.1 |
| 2010/0143842 A1 * | 6/2010 | Yamagishi et al. ......... 430/270.1 |
| 2011/0244188 A1 * | 10/2011 | Komoriya et al. ........... 428/156 |
| 2012/0003589 A1 * | 1/2012 | Park et al. ..................... 430/313 |

FOREIGN PATENT DOCUMENTS

| JP | 2000109525 A | 4/2000 |
| KR | 1020060046439 A | 5/2006 |
| KR | 1020090088329 A | 8/2009 |
| KR | 1020100048896 A | 5/2010 |
| KR | 10-1099506 B1 * | 12/2011 |

OTHER PUBLICATIONS

English translation of KR-10-1099506-B1 downloaded Sep. 8, 2013, 35 pages.*
International Search Report and Written Opinion of the International Searching Authority Application No. PCT/KR2011/007655 Completed: May 29, 2012; Mailing Date: May 30, 2012 6 pages.
Burnett et al., "Static and dynamic contact angles of water on photoresist"; J. Vac. Sci. Techn. B, 23(6), pp. 2721-2727 (Nov./Dec. 2005) (abstract only).

* cited by examiner

*Primary Examiner* — Cynthia Hamilton
(74) *Attorney, Agent, or Firm* — St. Onge Steward Johnston & Reens LLC

(57) ABSTRACT

A polymer compound and a resist protective film composition for an immersion lithography process including the same.

21 Claims, No Drawings

POLYMER COMPOUND, AND RESIST-PROTECTING FILM COMPOSITION INCLUDING SAME FOR A LIQUID IMMERSION EXPOSURE PROCESS

FIELD OF THE INVENTION

The present invention relates to a polymer compound and a resist protective film composition for an immersion lithography process that includes the polymer compound.

BACKGROUND OF THE INVENTION

Lithography methods are widely used in the production of microscopic structures in a variety of electronic devices such as semiconductor devices and liquid crystal devices. Ongoing miniaturization of the structures of these devices has lead to demands for further miniaturization of resist patterns used in these lithography processes.

Currently, in the most up-to-date fields, fine resist patterns with a line width of approximately 90 nm are able to be formed by lithography. In the future, however, even finer pattern formation will be required.

In order to enable the formation of these types of ultra fine patterns of less than 90 nm, the development of appropriate exposure apparatus and corresponding resist is the first requirement. With respect to the exposure apparatus, techniques such as shortening the wavelength of a light source for $F_2$ excimer lasers, extreme ultraviolet radiation (EUV), electron beams, X-rays, and soft X-rays or increasing the number of aperture (NA) of a lens are being developed.

However, shortening the wavelength of the light source requires a new and expensive exposure apparatus. Furthermore, if the NA value is increased, since the resolution and the depth of focus exist in a trade-off type relationship, even if the resolution is increased, a problem arises in that the depth of focus is lowered.

Recently, as a lithography technology for allowing such problems to be solved, a method known as immersion exposure has been reported. In this method, exposure is conducted in a state where liquid refractive index media such as pure water or a fluorine-based inert liquid (e.g., refractive index liquid and immersion liquid) is disposed in a predetermined thickness on at least a resist film between a lens and the resist film formed on a substrate. In this method, the space of an exposure light path conventionally filled with inert gas such as air or nitrogen is replaced with a liquid having a larger refractive index (n), for example pure water to attain high resolution without a decrease in focal depth width in a manner similar to the use of a light source of shorter wavelength or a high NA lens even if the optical source having the same exposure wavelength is employed.

Such liquid immersion lithography has been remarkably noticed because the use thereof allows a lens implemented in the existing device to realize the formation of a resist pattern excellent in higher resolution property as well as excellent in focal depth in low costs.

SUMMARY OF THE INVENTION

The present invention provides a polymer compound for a resist protective film composition for an immersion lithography process which has, in a liquid lithography process, a high receding contact angle and improved solubility and line edge roughness (LER) of a resist, and is excellent to be used in an immersion lithography process even in a small amount.

The present invention also provides a resist protective film composition for an immersion lithography process including the polymer compound.

The present invention also provides a method of forming a photoresist pattern by using the resist protective film composition for an immersion lithography process.

DETAILED DESCRIPTION OF THE INVENTION

According to an aspect of the present invention, there is provided a polymer compound including: 100 parts by mole of a repeating unit represented by Formula 1 below; 10 to 900 parts by mole of a repeating unit represented by Formula 2 below; and 10 to 900 parts by mole of a repeating unit represented by Formula 3 below, wherein the polymer compound has a weight average molecular weight of 1,000 to 100,000:

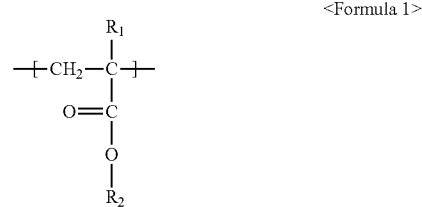

<Formula 1>

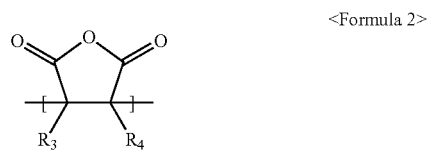

<Formula 2>

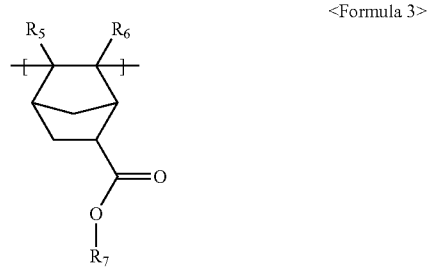

<Formula 3> wherein $R_1$, $R_3$, $R_4$, $R_5$, and $R_6$ are each independently a hydrogen (H) atom, a fluorine (F) atom, or a substituted or unsubstituted $C_1$-$C_{20}$ alkyl group, $R_2$ is a substituted or unsubstituted $C_1$-$C_{10}$ alkyl group or a substituted or unsubstituted $C_1$-$C_{10}$ cyclic alkyl group, wherein at least one hydrogen atom of the alkyl group and the cyclic alkyl group is substituted with a group represented by Formula a below, $R_7$ is a hydrogen atom or a substituted or unsubstituted $C_1$-$C_{25}$ alkyl group,

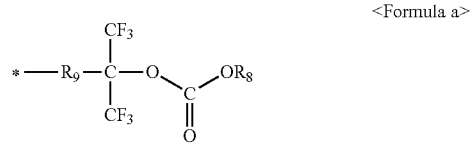

<Formula a> wherein $R_8$ is a hydrogen atom or a substituted or unsubstituted $C_1$-$C_{25}$ alkyl group, $R_9$ is a single bond or a substituted or unsubstituted $C_1$-$C_{10}$ alkylene group, and * indicates a binding site.

The polymer compound may further include at least one of 10 to 900 parts by mole of a repeating unit represented by Formula 4 below and 1 to 100 parts by mole of a repeating unit represented by Formula 5 below:

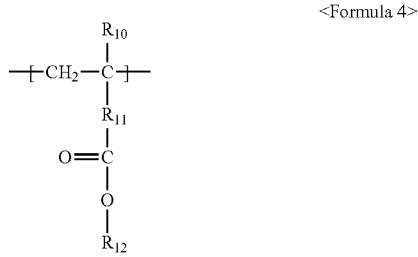

<Formula 4> wherein $R_{10}$ is a hydrogen (H) atom, a fluorine (F) atom, or a substituted or unsubstituted $C_1$-$C_{20}$ alkyl group, $R_{11}$ is a substituted or unsubstituted $C_1$-$C_{10}$ alkylene group, and $R_{12}$ is a hydrogen atom or a substituted or unsubstituted $C_1$-$C_{25}$ alkyl group,

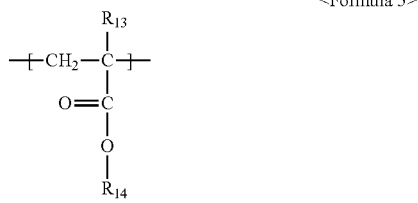

<Formula 5> wherein $R_{13}$ is a hydrogen (H) atom, a fluorine (F) atom, or a substituted or unsubstituted $C_1$-$C_{20}$ alkyl group, and $R_{14}$ is represented by Formula b below,

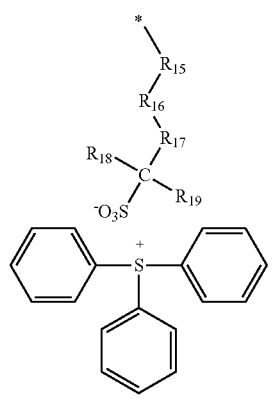

<Formula b> wherein $R_{15}$ and $R_{17}$ are each independently a single bond or a substituted or unsubstituted $C_1$-$C_{10}$ alkylene group, $R_{16}$ is a single bond, —O—, or —COO—, $R_{18}$ and $R_{19}$ are each independently a hydrogen (H) atom, a fluorine (F) atom, or a substituted or unsubstituted $C_1$-$C_{20}$ alkyl group, and * indicates a binding site.

According to another aspect of the present invention, there is provided a resist protective film composition for an immersion lithography process, the composition including the polymer compound described above and a solvent.

According to another aspect of the present invention, there is provided a method of forming a photoresist pattern, the method including: coating a photoresist composition on a substrate to form a photoresist film; coating the resist protective film composition for an immersion lithography process of claim 12 on the photoresist film to form a resist protective film; arranging an immersion medium between the resist protective film and a lens; and irradiating radiation to the photoresist film and the resist protective film via the immersion medium and a mask with a predetermined pattern and developing the irradiated films to form a resist pattern.

Hereinafter, a polymer compound according to an embodiment of the present invention and a resist protective film composition for an immersion lithography process including the same will be described in detail.

According to an embodiment of the present invention, there is provided a polymer compound that includes 100 parts by mole of a repeating unit represented by Formula 1 below; 10 to 900 parts by mole of a repeating unit represented by Formula 2 below; and 10 to 900 parts by mole of a repeating unit represented by Formula 3 below and has a weight average molecular weight of 1,000 to 100,000:

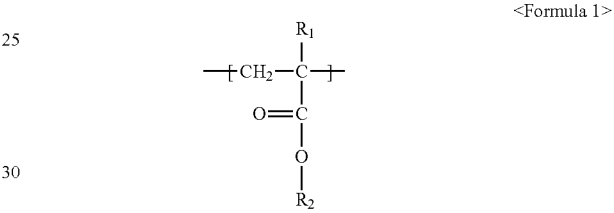

<Formula 1>

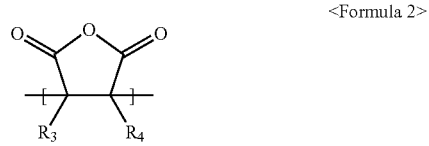

<Formula 2>

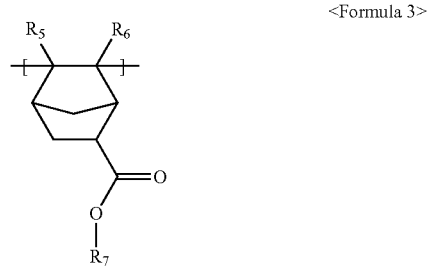

<Formula 3> wherein $R_1$, $R_3$, $R_4$, $R_5$, and $R_6$ are each independently a hydrogen (H) atom, a fluorine (F) atom, or a substituted or unsubstituted $C_1$-$C_{20}$ alkyl group, $R_2$ may be a substituted or unsubstituted $C_1$-$C_{10}$ alkyl group or a substituted or unsubstituted $C_1$-$C_{10}$ cyclic alkyl group, wherein at least one hydrogen atom of the alkyl group and the cyclic alkyl group may be substituted with a group represented by Formula a below;

$R_7$ may be a hydrogen atom or a substituted or unsubstituted $C_1$-$C_{25}$ alkyl group.

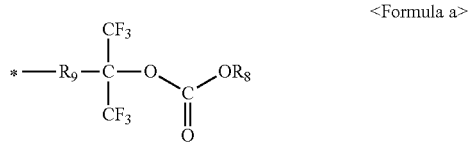

<Formula a>

In Formula a above, $R_8$ may be a hydrogen atom or a substituted or unsubstituted $C_1$-$C_{25}$ alkyl group, $R_9$ may be a single bond or a substituted or unsubstituted $C_1$-$C_{10}$ alkylene group, and * indicates a binding site.

In particular, $R_1$, $R_3$, $R_4$, $R_5$, and $R_6$ may be each independently a hydrogen (H) atom, a fluorine (F) atom, a methyl group, an ethyl group, a propyl group, a $C_1$-$C_{20}$ alkyl group substituted with at least one fluorine, or a $C_1$-$C_{20}$ alkyl group substituted with at least one hydroxyl group.

1 to 4 hydrogen atoms of $R_2$, i.e., a substituted or unsubstituted $C_1$-$C_{10}$ alkyl group or a substituted or unsubstituted $C_1$-$C_{10}$ cyclic alkyl group, may be substituted with the group of Formula a. In particular, if $R_2$ includes three hydrogen atoms like a methyl group, at most 3 hydrogen atoms thereof may be substituted with the group of Formula a.

In addition, $R_7$ may be a hydrogen atom, a $C_1$-$C_{25}$ alkyl group substituted with at least one hydroxyl group, or a $C_1$-$C_{25}$ alkyl group substituted with at least one carboxyl group.

In addition, $R_8$ may be a hydrogen atom or a substituted or unsubstituted $C_1$-$C_{10}$ alkyl group, and $R_9$ may be a single bond or a substituted or unsubstituted $C_1$-$C_5$ alkylene group.

The amount of the repeating unit of Formula 2 may be 10 to 900 parts by mole, for example, 50 to 600 parts by mole, for example, 80 to 300 parts by mole based on 100 parts by mole of the repeating unit of Formula 1. In this regard, when the amount of the repeating unit of Formula 2 is less than 10 parts by mole based on 100 parts by mole of the repeating unit of Formula 1, an alkali solubility of the polymer compound may be reduced and this may adversely affect maintaining a shape of a resist. On the other hand, when the amount of the repeating unit of Formula 2 is greater than 900 parts by mole based on 100 parts by mole of the repeating unit of Formula 1, the size of a receding contact angle may decrease and the polymer compound may be intermixed with a resist.

For example, the amount of the repeating unit of Formula 3 may be 10 to 900 parts by mole, for example, 30 to 600 parts by mole, for example, 50 to 300 parts by mole based on 100 parts by mole of the repeating unit of Formula 1. When the amount of the repeating unit of Formula 3 is less than 10 parts by mole based on 100 parts by mole of the repeating unit of Formula 1, an alkali solubility of the polymer compound may be reduced and this may adversely affect maintaining a shape of a resist. On the other hand, when the amount of the repeating unit of Formula 3 is greater than 900 parts by mole based on 100 parts by mole of the repeating unit of Formula 1, the size of a receding contact angle may decrease and the polymer compound may be intermixed with a resist.

The polymer compound has a weight average molecular weight of 1,000 to 100,000, for example, 3,000 to 50,000, and, for example, 5,000 to 20,000. When the weight average molecular weight of the polymer compound is less 1,000, its capability of forming a resist protective film is reduced. On the other hand, when the weight average molecular weight of the polymer compound is greater than 100,000, an alkali solubility of the polymer compound may be reduced and the viscosity of a composition including the polymer compound increases, resulting in difficulty of handling.

In addition, a polymer dispersity index (PDI), which is a ratio (Mw/Mn) of a weight average molecular weight (Mw) of the polymer compound to a number average molecular weight (Mn) of polystyrene that is measured by gel permeation chromatography (GPC), may be 1 to 5, for example, 1 to 3.

The repeating unit of Formula 1 may be represented by any one of Formulae 1-1 through 1-18 below, but is not limited thereto:

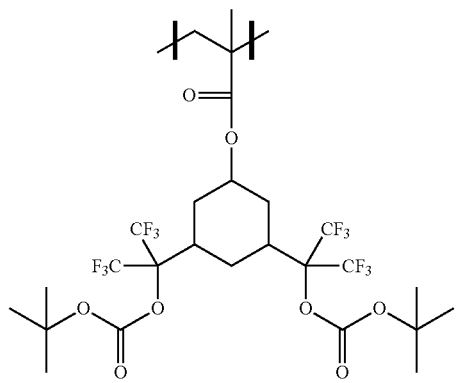

<Formula 1-1>

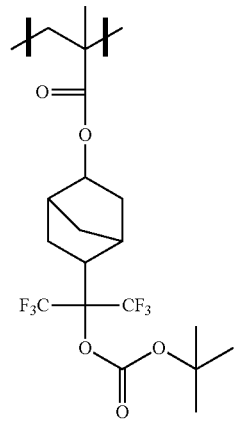

<Formula 1-2>

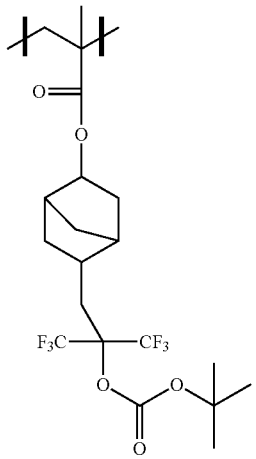

<Formula 1-3>

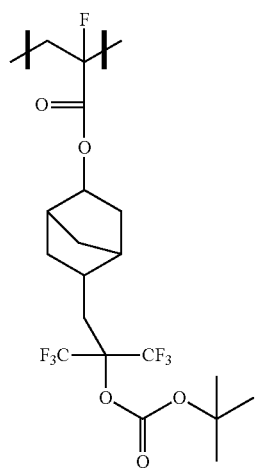
<Formula 1-4>
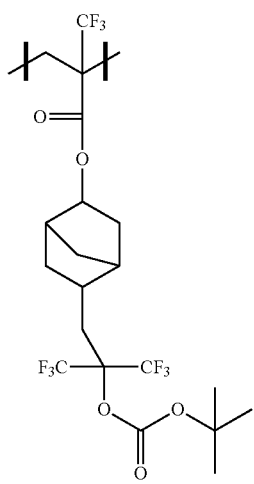
<Formula 1-7>
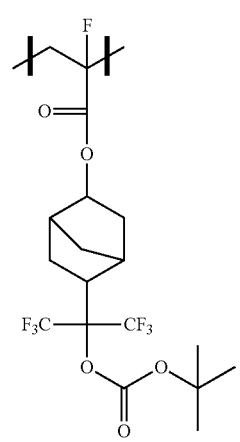
<Formula 1-5>
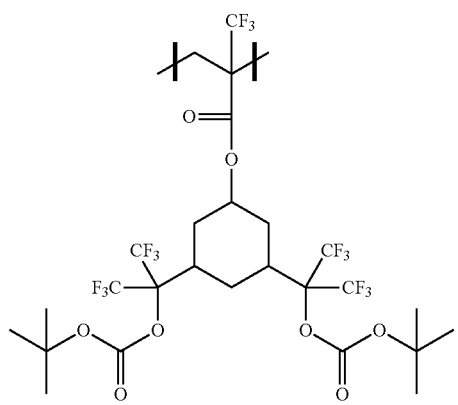
<Formula 1-8>
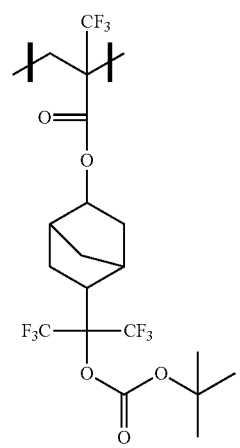
<Formula 1-6>
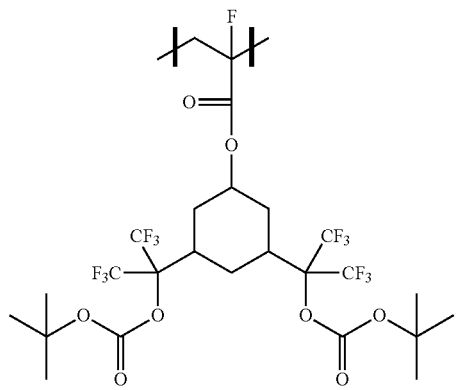
<Formula 1-9>

<Formula 1-10>
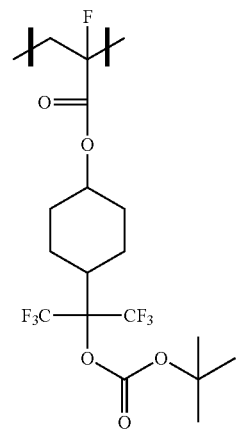
<Formula 1-11>
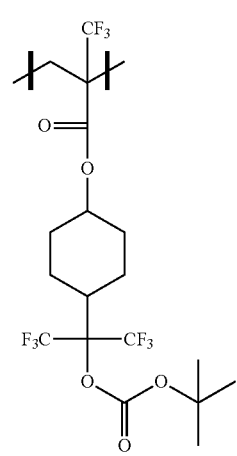
<Formula 1-12>
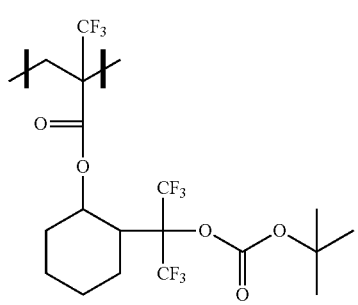
<Formula 1-13>
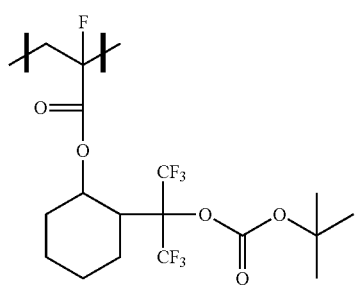
<Formula 1-14>
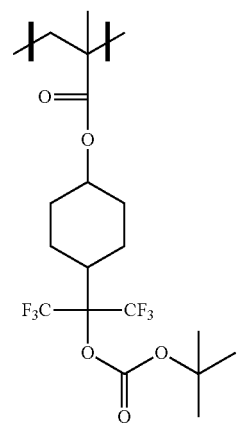
<Formula 1-15>
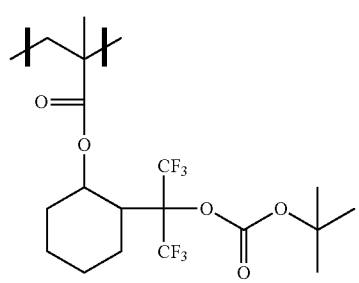
<Formula 1-16>
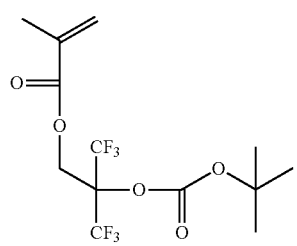
<Formula 1-17>
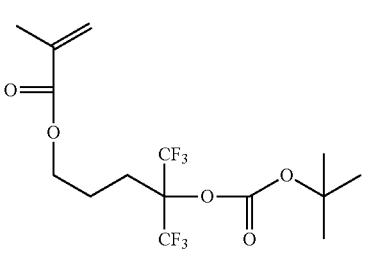
<Formula 1-18>
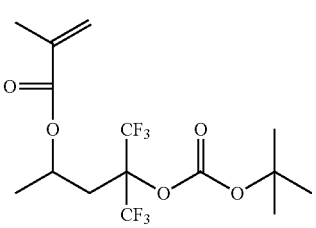

The repeating unit of Formula 2 may be represented by Formula 2-1 below, but is not limited thereto:

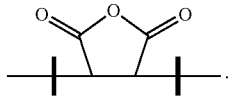

<Formula 2-1>

The repeating unit of Formula 3 may be represented by one of Formulae 3-1 through 3-3, but is not limited thereto:

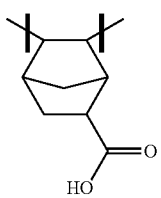

<Formula 3-1>

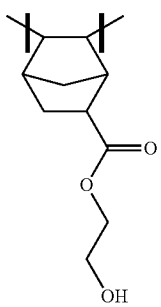

<Formula 3-2>

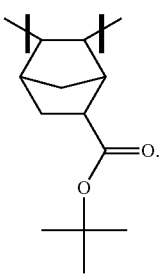

<Formula 3-3>

As described above, the polymer compound may be a ter-copolymer having the repeating units of Formulae 1 through 3 above. Also, the polymer compound may further include a repeating unit represented by Formula 4 below and a repeating unit represented by Formula 5 below and, that is, may be a quarter- or penta-copolymer:

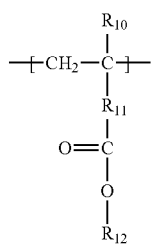

<Formula 4> wherein $R_{10}$ is a hydrogen (H) atom, a fluorine (F) atom, or a substituted or unsubstituted $C_1$-$C_{20}$ alkyl group, $R_{11}$ is a substituted or unsubstituted $C_1$-$C_{10}$ alkylene group, and $R_{12}$ is a hydrogen atom or a substituted or unsubstituted $C_1$-$C_{25}$ alkyl group,

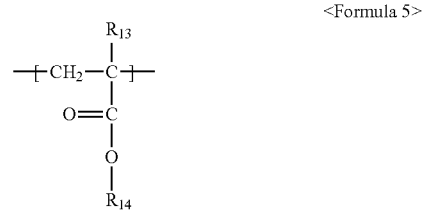

<Formula 5> wherein $R_{13}$ is a hydrogen (H) atom, a fluorine (F) atom, or a substituted or unsubstituted $C_1$-$C_{20}$ alkyl group, and $R_{14}$ is represented by Formula b below,

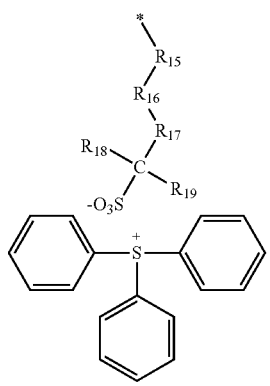

<Formula b> wherein $R_{15}$ and $R_{17}$ are each independently a single bond or a substituted or unsubstituted $C_1$-$C_{10}$ alkylene group, $R_{16}$ is a single bond, —O—, or —COO—, $R_{18}$ and $R_{19}$ are each independently a hydrogen (H) atom, a fluorine (F) atom, or a substituted or unsubstituted $C_1$-$C_{20}$ alkyl group, and * indicates a binding site.

In particular, $R_{10}$ and $R_{13}$ may be each independently a hydrogen (H) atom, a fluorine (F) atom, a methyl group, an ethyl group, a propyl group, a $C_1$-$C_{20}$ alkyl group substituted with at least one fluorine, or a $C_1$-$C_{20}$ alkyl group substituted with at least one hydroxyl group.

In addition, $R_{12}$ may be a hydrogen atom, a $C_1$-$C_{25}$ alkyl group substituted with at least one hydroxyl group, or a $C_1$-$C_{25}$ alkyl group substituted with at least one carboxyl group, $R_{11}$, $R_{15}$, and $R_{17}$ may be a single bond or a substituted or unsubstituted $C_1$-$C_5$ alkylene group, $R_{16}$ may be —COO—, and $R_{18}$ and $R_{19}$ may be each independently a fluorine atom.

The amount of the repeating unit of Formula 4 may be 10 to 900 parts by mole, for example, 30 to 600 parts by mole, for example, 50 to 300 parts by mole based on 100 parts by mole of the repeating unit of Formula 1. When the amount of the repeating unit of Formula 4 is within this range, an alkali solubility of the polymer compound increases and thus a shape of a resist and a high receding contact angle may be maintained.

The amount of the repeating unit of Formula 5 may be 1 to 100 parts by mole, for example, 1 to 50 parts by mole, for example, 1 to 30 parts by mole based on 100 parts by mole of the repeating unit of Formula 1.

The repeating unit of Formula 5 has a structure in which a radiation-sensitive acid-generating compound capable of generating an acid upon application of radiation is bonded to a terminal of a side chain thereof. Thus, when the amount of the repeating unit of Formula 5 is within this range, thermal stability is improved and line edge roughness of a pattern shape decreases and thus it is possible to form a uniform pattern.

In addition, the repeating unit of Formula 4 may be represented by Formulae 4-1 through 4-12, but is not limited thereto:

<Formula 4-1>

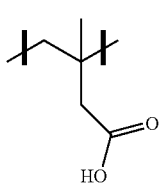

<Formula 4-2>

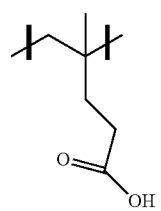

<Formula 4-3>

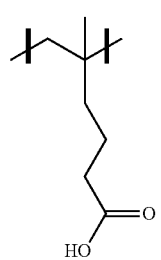

<Formula 4-4>

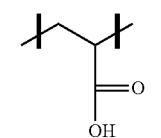

<Formula 4-5>

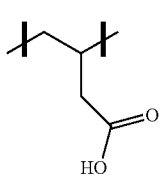

<Formula 4-6>

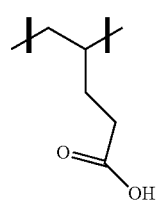

<Formula 4-7>

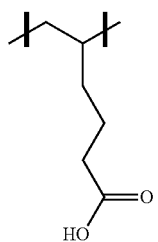

<Formula 4-8>

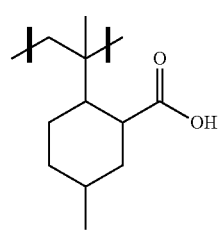

<Formula 4-9>

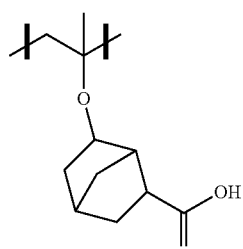

<Formula 4-10>

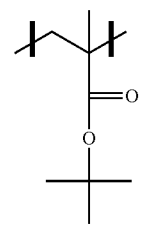

<Formula 4-11>

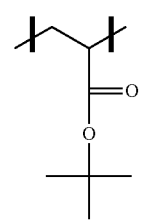

<Formula 4-12>

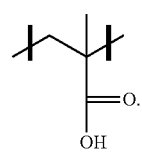

The repeating unit of Formula 5 may be represented by Formulae 5-1 through 5-11, but is not limited thereto.
<Formula 5-1>
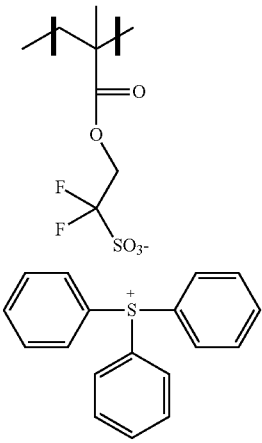
<Formula 5-2>
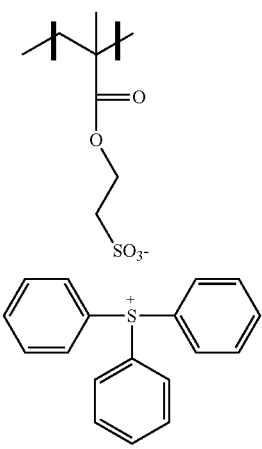
<Formula 5-3>
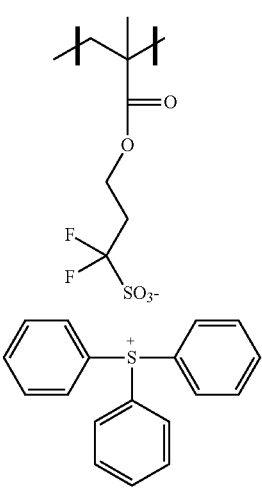
<Formula 5-4>
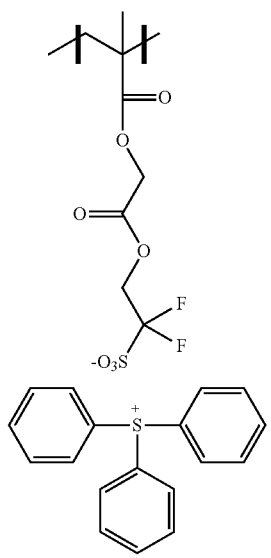
<Formula 5-5>
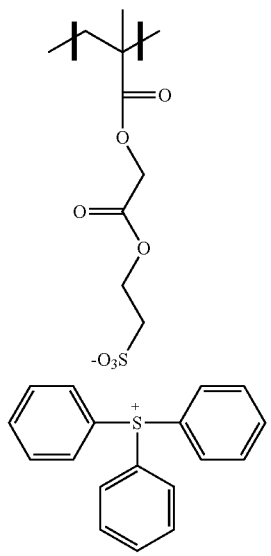

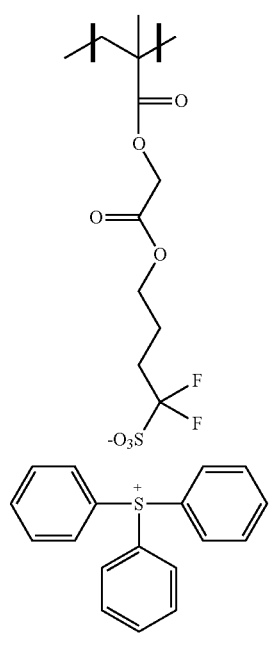
<Formula 5-6>
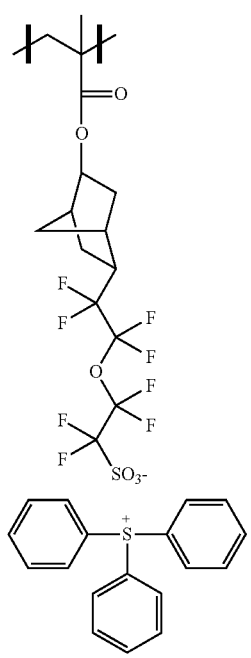
<Formula 5-8>
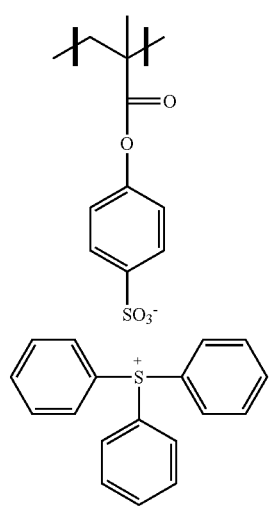
<Formula 5-7>
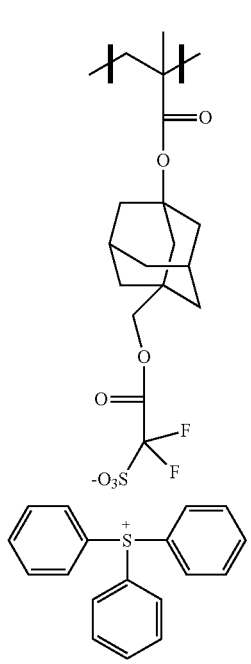
<Formula 5-9>

-continued
<Formula 5-10>
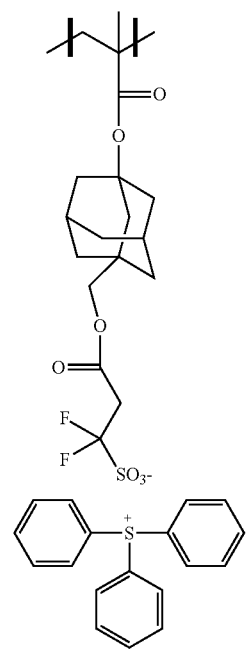
<Formula 5-11>
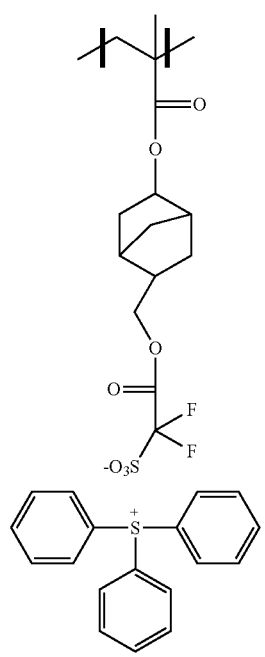
For example, the polymer compound (ter-copolymer) may be represented by Formulae 6 through 11 below:
<Formula 6>
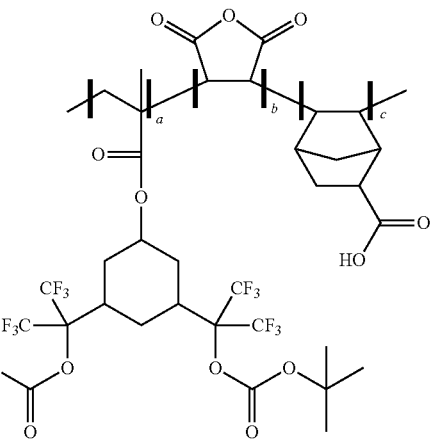
<Formula 7>
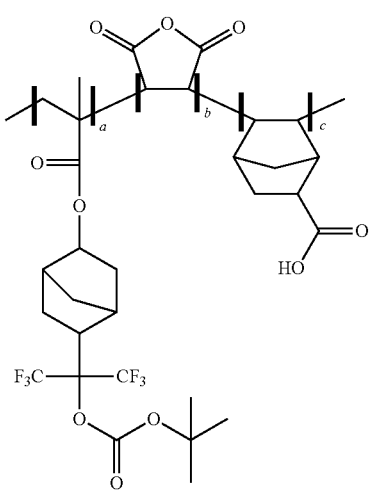
<Formula 8>
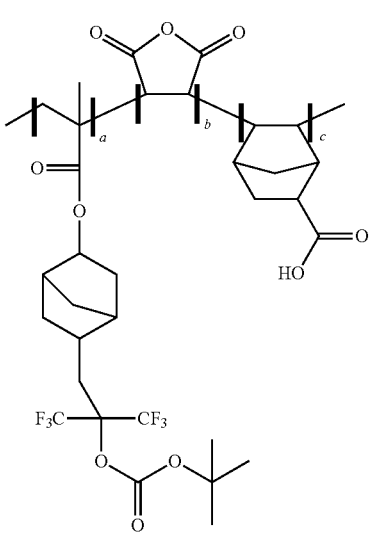

<Formula 9>

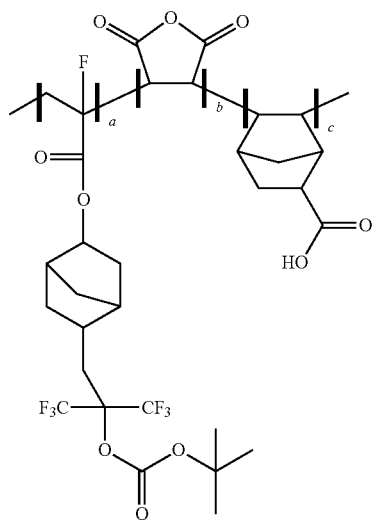

<Formula 10>

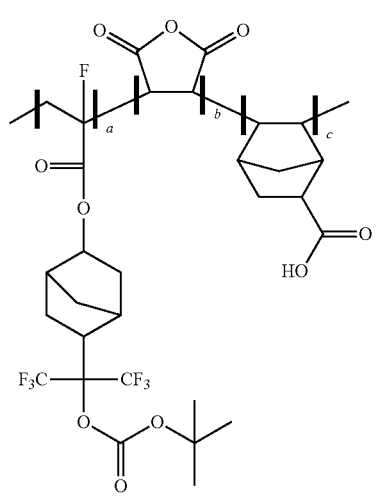

<Formula 11>

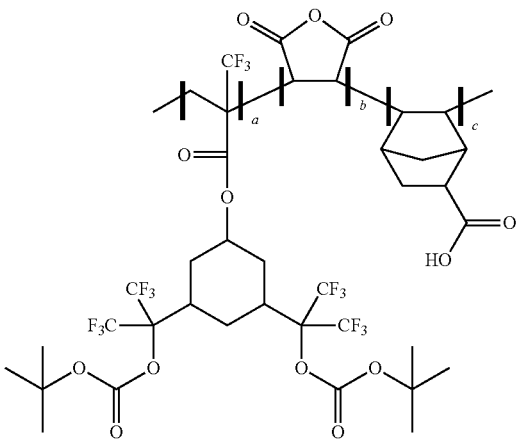

wherein a is 100 parts by mole, b is 10 to 900 parts by mole, c is 10 to 900 parts by mole.

In addition, the polymer compound (quarter- or penta-copolymer) may be represented by Formulae 12 through 20 below. In this regard, it is obvious to one of ordinary skill in the art that repeating units of the polymer compounds of Formulae 12 through 20 are not configured in the order as illustrated below and the polymer compound includes all the polymer compounds in the form of a random copolymer whose repeating units are randomly arranged:

<Formula 12>

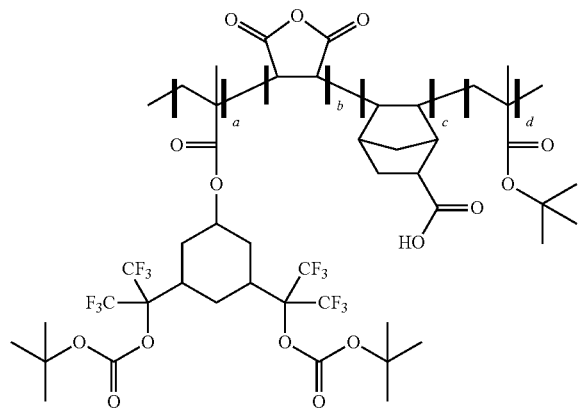

<Formula 13>

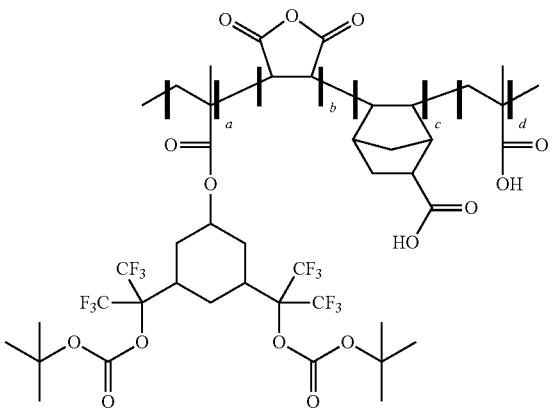

<Formula 14>
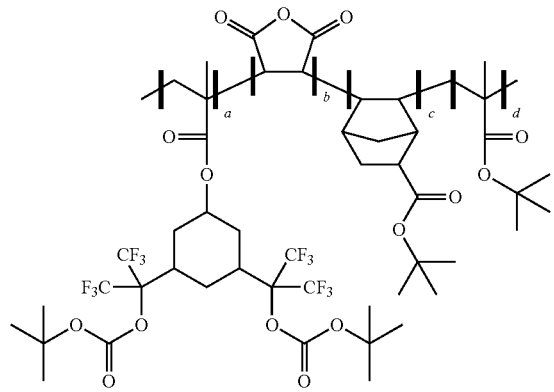
<Formula 15>
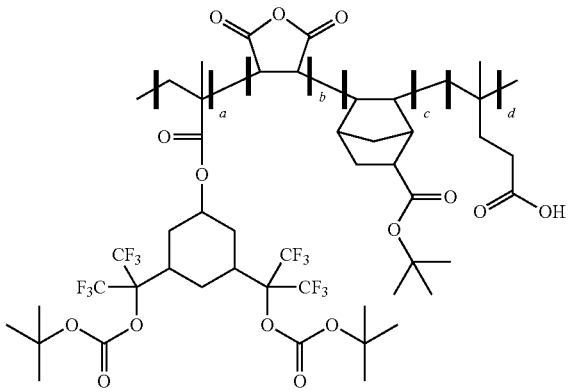
<Formula 16>
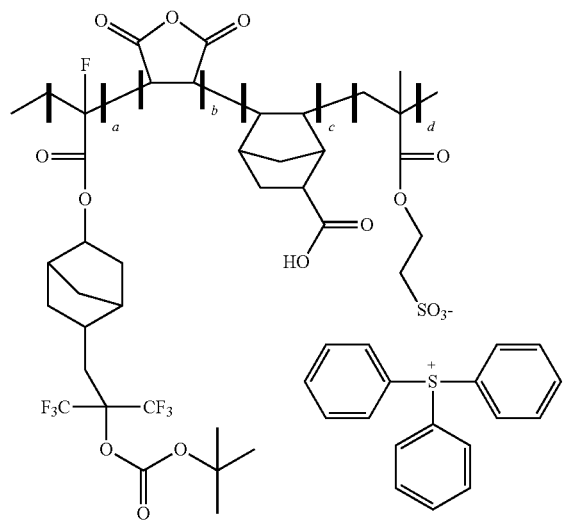
<Formula 17>
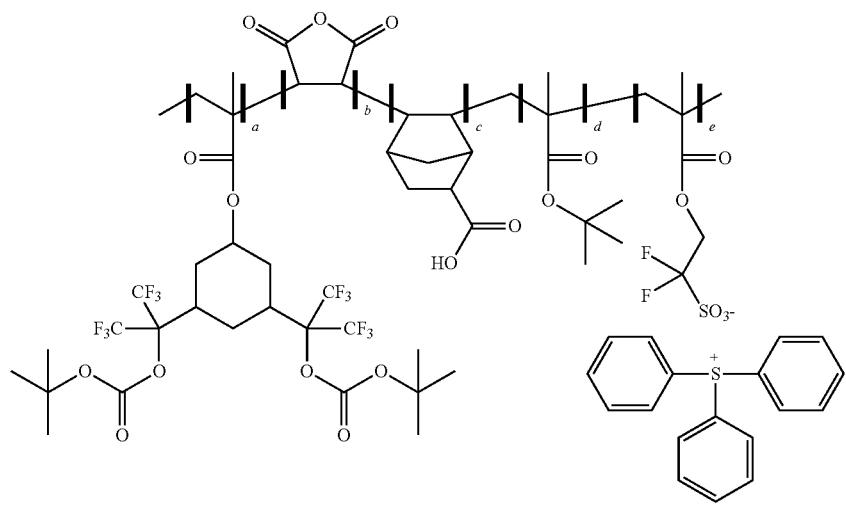

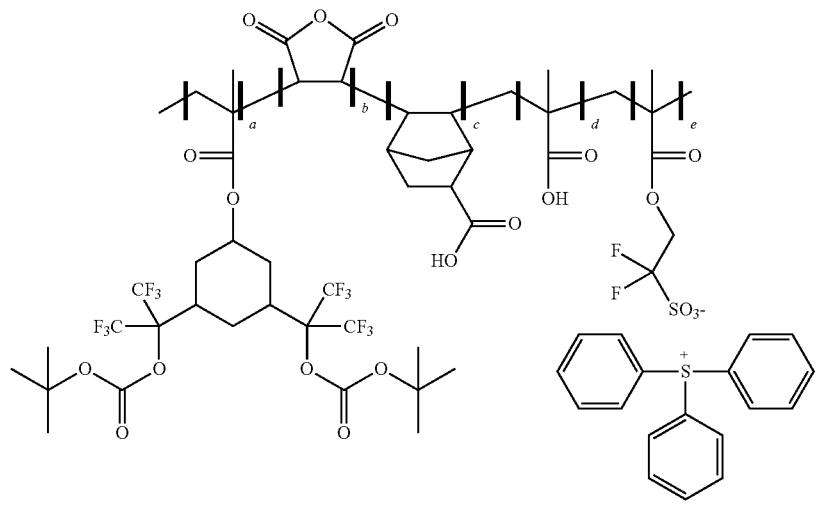
<Formula 18>
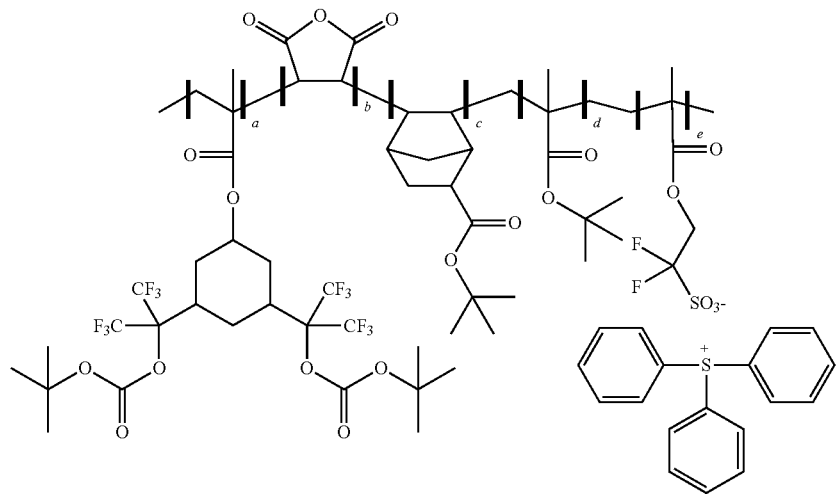
<Formula 19>
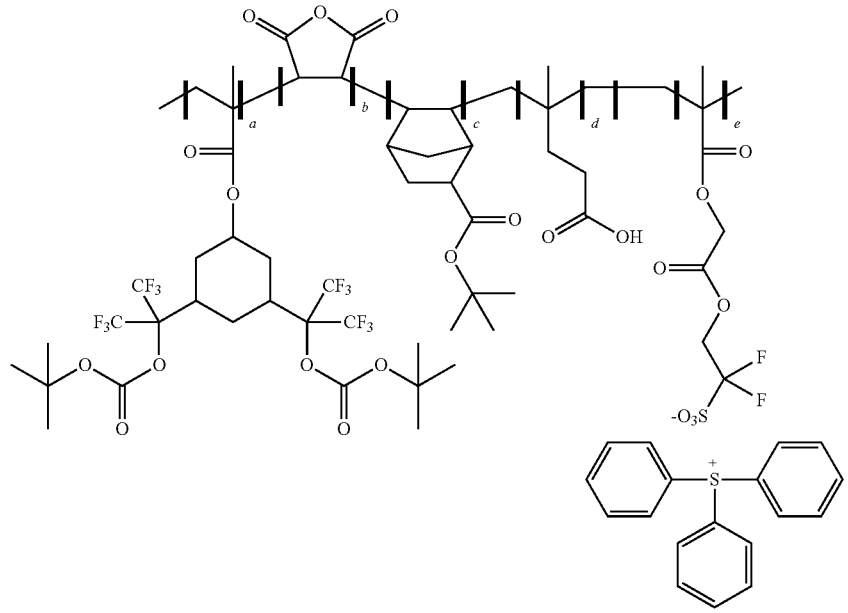
<Formula 20> wherein a is 100 parts by mole, b is 10 to 900 parts by mole, c is 10 to 900 parts by mole, d is 10 to 900 parts by mole, and e is 1 to 100 parts by mole.

The substituents of the polymer compound are described as follows:

The alkyl group as used herein refers to a linear or branched saturated monovalent hydrocarbon group having 1 to 20 carbon atoms, for example, 1 to 10 carbon atoms, for example, 1 to 6 carbon atoms.

Examples of the unsubstituted alkyl group include methyl, ethyl, propyl, isobutyl, sec-butyl, tert-butyl, pentyl, iso-amyl, and hexyl, and at least one hydrogen atom of the unsubstituted alkyl group may be substituted with a halogen atom, a hydroxyl group, a nitro group, a cyano group, a substituted or unsubstituted amino group (e.g., $-NH_2$, $-NH(R)$, $-N(R')(R'')$ wherein R' and R'' are each independently a, $C_1$-$C_{10}$ alkyl group), an amidino group, hydrazine, hydrazone, a carboxyl group, a sulfonic acid group, a phosphoric acid group, a $C_1$-$C_{20}$ alkyl group, a $C_1$-$C_{20}$ halogenated alkyl group, a $C_1$-$C_{20}$ alkenyl group, a $C_1$-$C_{20}$ alkynyl group, a $C_1$-$C_{20}$ heteroalkyl group, a $C_6$-$C_{20}$ aryl group, a $C_6$-$C_{20}$ arylalkyl group, a $C_6$-$C_{20}$ heteroaryl group, or a $C_6$-$C_{20}$ heteroarylalkyl group.

The alkylene group as used herein refers to a straight or branched chain divalent hydrocarbon group that only consists of carbon and hydrogen, has no degree of unsaturation, and has 1 to 10 carbon atoms, for example, 1 to 5 carbon atoms. Examples of the alkylene group include methylene, ethylene, propylene, and n-butylene. At least one hydrogen atom of the alkylene group may be substituted with the same substituent as in the alkyl group described above.

According to another embodiment of the present invention, there is provided a resist protective film composition for an immersion lithography process which includes the polymer compound described above and a solvent.

The amount of the polymer compound may be 1 to 20 parts by weight, for example, 1 to 15 parts by weight, for example, 1 to 10 parts by weight based on 100 parts by weight of the solvent. When the amount of the polymer compound is within this range, the obtained composition has an appropriate viscosity for forming a resist protective film and the thickness of the resist protective film may be easily adjusted.

The solvent may include at least one selected from monovalent alcohols, polyols, alkyl ethers of polyols, alkyl ether acetates of polyols, ethers, cyclic ethers, alkanes, alkoxy alkanes, aromatic hydrocarbons, ketones, esters, and water.

The monovalent alcohols may be $C_4$-$C_{11}$ monovalent alcohols such as 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, 2,6-dimethyl-4-heptanol, 3,5,5-trimethyl-1-hexanol, 1-nonanol, 1-decanol, methyl-n-octylcarbinol, ethyl heptyl carbinol, hexyl propyl carbinol, amyl butyl carbinol, 2-undecanol, 3-undecanol, 4-undecanol, 5-undecanol, 3,7-dimethyl-1-octanol.

Examples of the polyols include ethylene glycol, propylene glycol, 4-hydroxy-4-methyl-2-pentanol, 2-ethyl-1,3-hexanediol, 1,3-butandiol, 1,2-propanediol, 1,3-propanediol, 1,2-heptandiol, and the polyols may be $C_4$-$C_8$ divalent alcohols. Examples of the alkyl ethers of polyols include ethylene glycol monomethyl ether, ethylene glycol monoethyl ether, diethylene glycol monomethyl ether, diethylene glycol monoethyl ether, diethylene glycol ethyl methyl ether, propylene glycol monomethyl ether, and propylene glycol monoethyl ether, and examples of the alkyl ether acetates of polyols include ethylene glycol ethyl ether acetate, diethylene glycol ethyl ether acetate, propylene glycol ethyl ether acetate, and propylene glycol monomethyl ether acetate.

Examples of the ethers include diethyl ether, dipropyl ether, diisopropyl ether, butyl methyl ether, butyl ethyl ether, butyl propyl ether, dibutyl ether, diisobutyl ether, tert-butylmethyl ether, tert-butyl ethyl ether, tert-butyl propyl ether, di-tert-butyl ether, dipentyl ether, diisoamyl ether, cyclopentyl methyl ether, cyclohexyl methyl ether, cyclopentyl ethyl ether, cyclohexyl ethyl ether, cyclopentyl propyl ether, cyclopentyl-2-propyl ether, cyclohexyl propyl ether, cyclohexyl-2-propyl ether, cyclopentyl butyl ether, cyclopentyl-tert-butyl ether, cyclohexyl butyl ether, and cyclohexyl-tert-butyl ether. Examples of the cyclic ethers include tetrahydrofuran and dioxane.

Examples of the alkanes include decan, dodecane, and undecan.

The alkoxyalkanes may be dialkoxy alkanes, trialkoxy alkanes or tetraalkoxy alkanes that include 3 to 16 carbon atoms. The alkoxy alkane may be at least one selected from dimethoxy methane, diethoxy methane, dibutoxy methane, trimethoxy methane, triethoxy methane, tripropoxy methane, 1,1-dimethoxy ethane, 1,2-dimethoxy ethane, 1,1-diethoxy ethane, 1,2-diethoxy ethane, 1,2-dibutoxy ethane, 1,1,1-trimethoxy ethane, 1,1-diethoxy propane, 2,2-dimethoxy propane, 2,2-diethoxy propane, 1,1-diethoxy isobutane, 1,5-dimethoxy pentane, 1,6-dimethoxy hexane, 1,1-dimethoxy octane, 1,1-dimethoxy dodecane, bis(2-ethoxyethyl)ether, and bis(2-methoxyethyl)ether.

Examples of the aromatic hydrocarbons include benzene, toluene, and xylene. Examples of the ketones include acetone, methyl ethyl ketone, methyl isobutyl ketone, cyclohexanone, 4-hydroxy-4-methyl-2-pentanone, and diacetone alcohol. Examples of the esters include ethyl acetate, butyl acetate, 2-hydroxyethyl propionate, 2-hydroxy-2-methyl methyl propionate, 2-hydroxy-2-methyl ethyl propionate, ethoxyethyl acetate, hydroxyethyl acetate, 2-hydroxy-3-methyl methylbutyrate, 3-methoxymethyl propionate, 3-methoxyethyl propionate, 3-ethoxyethyl propionate, and 3-ethoxymethyl propionate.

In particular, the solvent may be a monovalent alcohol, ether, cyclic ether, alkyl ether of polyol, alkyl ether acetate of polyol, and higher hydrocarbon. More particularly, the solvent may be a $C_9$-$C_{11}$ monovalent alcohol or alkyl ether having a $C_4$-$C_{10}$ alkyl chain. The solvent may be used alone or in combination of at least two of these compounds.

The resist protective film composition for an immersion lithography process may further include at least one of a radiation-sensitive acid-generating compound and an acid compound to improve the performance of lithography.

The radiation-sensitive acid-generating compound may be any compound that is generally used to improve lithography performance of a resist and examples of the radiation-sensitive acid-generating compound include a sulfone imide compound, an onium salt compound, a sulfone compound, a sulfonic acid ester compound, and diazomethane compound.

The acid compound may be, for example, carboxylic acids or sulfonic acids. In particular, the acid compound may be at least one selected from 2,4-difluorophenyl acetate, 3,5-difluorophenyl acetate, 3,5-bis(trifluoromethyl)phenyl acetate, 3-fluoro-4-hydroxyphenyl acetate, (2,5-dimethoxyphenyl) acetate, 4-hydroxy-3-nitrophenyl acetate, 2,3,4,5,6-pentafluorophenyl acetate, 1-naphthyl acetate, 2-naphthyl acetate, (1-naphthoxy)acetate, (2-naphthoxy)acetate, 2-fluorobenzoate, 2-trifluoromethylbenzoate, 2-nitrobenzoate, 3-fluorobenzoate, 3-trifluoromethylbenzoate, 3-methoxybenzoate, 4-fluorobenzoate, 4-trifluoromethylbenzoate, 4-nitrobenzoate, 3-fluoro-2-methylbenzoate, 2,3-difluorobenzoate, 2,6-difluorobenzoate, 2-fluoro-6-trifluoromethylbenzoate, 2-fluoro-3-trifluoromethylbenzoate, 2,6-bis(trifluoromethyl)benzoate, 2-methyl-6-nitrobenzoate, 3-methyl-2-nitrobenzoate, 2-methyl-3-nitrobenzoate, 5-fluoro-2-methylbenzoate, 3-fluoro-4-methylbenzoate, 2,4-bis(trifluoromethyl)benzoate, 2,5-bis(trifluoromethyl)benzoate, 2,4-difluorobenzoate, 3,4-difluorobenzoate, 2-fluoro-4-trifluoromethylbenzoate, 2,5-difluorobenzoate, 3-fluoro-4-methoxybenzoate, 5-methyl-2-nitrobenzoate, 4-methyl-3-nitrobenzoate, 3-methyl-4-nitrobenzoate, 2-methyl-5-nitrobenzoate, 2-fluoro-5-nitrobenzoate, 4-fluoro-3-nitrobenzoate, 4-methoxy-3-nitrobenzoate, 3-methoxy-4-nitrobenzoate, 3-hydroxy-4-nitrobenzoate, 2-hydroxy-5-nitrobenzoate, 2,4-dinitrobenzoate, 3,4-dinitrobenzoate, 3,5-difluorobenzoate, 3,5-bis(trifluoromethyl)benzoate, 3,5-dinitrobenzoate, 2,3,4-trifluorobenzoate, 2,3,6-trifluorobenzoate, 2,4,6-trifluorobenzoate, 3,4,5-trifluorobenzoate, 4-methyl-3,5-dinitrobenzoate, 4-hydroxy-3,5-dinitrobenzoate, 3,5-dinitrosalicylate, 2,4,5-trifluorobenzoate, 2,3,4,5-tetrafluorobenzoate, 2,3,5,6-tetrafluorobenzoate, 2,3,5,6-tetrafluoro-4-methylbenzoate, pentafluorobenzoate, 2,3,4,5,6-pentafluorophenoxyacetate, 1-naphthalenecarboxylate, 2-naphthalenecarboxylate, 4-fluoro-1-naphthalenecarboxylate, 1-hydroxy-2-naphthalenecarboxylate, 2-hydroxy-1-naphthalenecarboxylate, 3-hydroxy-2-naphthalenecarboxylate, 1,4-dihydroxy-2-naphthalenecarboxylate, 3,5-dihydroxy-2-naphthalenecarboxylate, 1,4-naphthalenedicarboxylate, 2,3-naphthalenedicarboxylate, 2,6-naphthalenedicarboxylate, methanesulfonic acid, ethanesulfonic acid, taurine, 3-[(1,1-dimethyl-2-hydroxyethyl)amino]-2-hydroxy-1-propanesulfonic acid, 3-[bis(2-hydroxyethyl)amino]-2-hydroxy-1-propanesulfonic acid, (1R)-(−)-10-camphorsulfonic acid, (1S)-(+)-10-camphorsulfonic acid, trifluoromethylsulfonate, perfluorobutanesulfonic acid, perfluorooctanesulfonic acid, (methylamino)sulfonic acid, (butylamino)sulfonic acid, 1,1,2,2-tetrafluoro-2-(tetracyclo[4.4.0.12,5.17,10]dodecane-8-ypethanesulfonic acid, 1,1-difluoro-2-(tetracyclo[4.4.0.12,5.17,10]dodecane-8-yl) ethanesulfonic acid, dodecyl benzene sulfonic acid, nonafluoro butane sulfonic acid, 1-naphthoic acid, 3-hydroxy-2-naphthoic acid, and lactic acid.

The acid-generating compound and the acid compound each may be used alone or in combination of at least two of these compounds.

The amount of each of the acid-generating compound and the acid compound may be 0.001 to 10 parts by weight, for example, 0.003 to 5 parts by weight, for example, 0.005 to 3 parts by weight based on 100 parts by weight of the polymer compound. When the amount of each of the acid-generating compound and the acid compound is within this range, a resist pattern is uniformly formed and line edge roughness of the polymer compound may be improved.

According to another embodiment of the present invention, there is provided a method of forming a photoresist pattern, the method including coating a photoresist composition on a substrate to form a photoresist film; coating the resist protective film composition for an immersion lithography process on the photoresist film to form a resist protective film; arranging an immersion medium between the resist protective film and a lens; and irradiating radiation to the photoresist film and the resist protective film via the immersion medium and a mask with a predetermined pattern and developing the irradiated films to form a resist pattern.

First, in the coating of the photoresist composition on a substrate, the substrate may be a silicon wafer or a wafer coated with aluminum. A photoresist used is not particularly limited and may be appropriately selected according to the application of a resist.

The photoresist film is formed by dissolving a resin for forming a photoresist film in an appropriate solvent to form a solution, filtering the solution to prepare a resist solution, coating the resist solution on a substrate by using an appropriate coating method, and pre-sintering the coated substrate to volatilize the solvent.

The coating of the resist protective film composition on the photoresist film to form a resist protective film includes coating the resist protective film composition on the photoresist film and generally sintering the coated photoresist film. This process is performed to protect the photoresist film and form the resist protective film in order to prevent a lens of a projection exposure device from being contaminated by leakage of liquid components contained in a resist from the photoresist film.

As the thickness of the resist protective film comes close to an odd multiple of $\lambda/4n$ ($\lambda$ is the wavelength of radiation and n is a refractive index of the resist protective film), an inhibiting effect of reflection at an upper interface of a resist film increases. Thus, the thickness of the resist protective film may approximate this value. In addition, any one of the pre-sintering process after the coating of the resist solution and the sintering process after the coating of the resist protective film composition may not be performed to simplify manufacturing processes.

The arranging of the immersion medium between the resist protective film and a lens, and the irradiating of the radiation to the photoresist film and the resist protective film via the immersion medium and a mask with a predetermined pattern and the developing of the irradiated films to form a resist pattern includes performing immersion lithography on the photoresist film and the resist protective film, sintering the films at a predetermined temperature and developing the sintered films.

The pH of the immersion medium arranged between the resist protective film and the lens may be adjusted, and, in particular, the immersion medium therebetween may be pure water.

The radiation used in the immersion lithography may be selected from visible rays; ultraviolet rays such as g-rays and i-rays; far-ultraviolet rays such as an excimer laser; X-rays such as synchrotron radiation; and charged particle beams such as electro beams, according to the used photoresist film and a combination of the photoresist film and the resist protective film for immersion. In particular, the radiation may be an ArF excimer laser (wavelength: 193 nm) or a KrF excimer laser (wavelength: 248 nm).

In addition, to improve resolution, pattern shape, and developing properties of a resist film, a sintering process may be performed after exposure to light. The sintering temperature may be appropriately adjusted according to a resist and may be generally in the range of about 30 to 200° C., for example, in the range of 50 to 150° C.

The photoresist film is developed using a developer and washed to from a desired resist pattern. In this case, the resist protective film for an immersion lithography process does not need to be peeled and is completely removed during the developing process or the washing process after the developing process. This is one of main characteristics of the embodiments of the present invention.

Examples of the developer used to form a resist pattern may include aqueous alkaline solutions obtained by dissolving sodium hydroxide, potassium hydroxide, sodium carbonate, sodium silicate, sodium metasilicate, ammonia, ethyl amine, n-propyl amine, diethyl amine, di-n-propyl amine, triethyl amine, methyl diethyl amine, dimethyl ethanol amine, triethanol amine, tetramethyl ammonium hydroxide, tetraethyl ammonium hydroxide, pyrrole, piperidine, choline, 1,8-diazabicyclo-[5,4,0]-7-undecene, and 1,5-diazabicyclo-[4,3,0]-5-nonane, respectively. In addition, an appropriate amount of an aqueous organic solvent, for example, alcohol such as methanol or ethanol or a surfactant may be added to the developer. When a developing process is performed using the aqueous alkaline solution, the developing process is generally followed by a washing process.

ADVANTAGEOUS EFFECTS

According to the one or more embodiment of the present invention, there are provided a polymer compound for a resist protective film composition for an immersion lithography process which has a high receding contact angle in a liquid lithography process and improved solubility and line edge roughness (LER) of a resist and is suitable for use in an immersion lithography process even in a small amount and a resist protective film composition including the polymer compound.

BEST MODE FOR CARRYING OUT THE INVENTION

One or more embodiments of the present invention will now be described in greater detail with reference to the following examples. However, these examples are for illustrative purpose only and are not intended to limit the scope of the invention.

Preparation Example 1

Preparation of Monomer Having Repeating Unit Represented by Formula 1-1

As illustrated in Reaction Scheme 1 below, to a 2 L three-neck flask were added 160 g (0.32 mol) of a monomer having a hexafluoroalcohol group below and the like, i.e., MA-3,5-bis(hexafluoro-2-hydroxy-2-propyl)cyclohexyl methacrylate, 150.49 g (0.676 mol) of di-tert-butyl dicarbonate, 7.66 g (0.061 mol) of 4-dimethylaminopyridine (DMAP), and 959 g of tetrahydrofuran (THF), and the mixture was maintained at room temperature for 20 hours to induce a reaction therebetween. After the reaction was terminated, THF was removed under reduced pressure from the reaction product to obtain 219 g of a monomer having a repeating unit represented by Formula 1-1 below {yield: 97.8%, NMR: $CH_3$ (1.93, 1.40), $CH_2$ (1.64, 1.36), CH (3.91, 2.01), H (6.15, 5.58))}.

<Reaction Scheme 1>

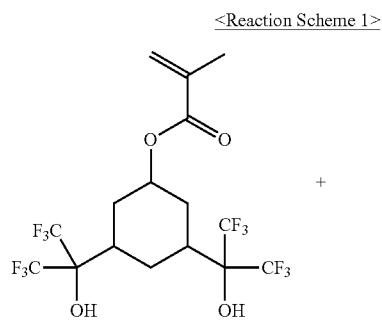

+

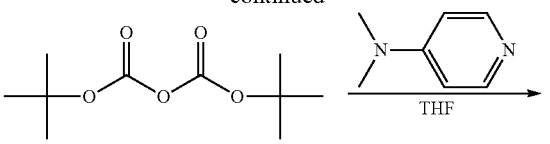

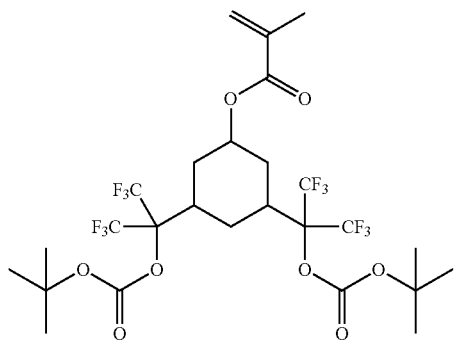

(Formula 1-1)

Preparation Example 2

Preparation of Monomer Having Repeating Unit Represented by Formula 1-2

As illustrated in Reaction Scheme 2 below, to a 2 L three-neck flask were added 140 g (0.404 mol) of a monomer having a hexafluoroalcohol group below and the like, i.e., t-Boc-1,1,1,3,3,3-hexafluoro-norbornane-mathacrylate, 190.25 g (0.854 mol) of di-tert-butyl dicarbonate, 9.68 g (0.078 mol) of DMAP, and 1,020 g of THF, and the mixture was maintained at room temperature for 20 hours to induce a reaction therebetween. After the reaction was terminated, THF was removed under reduced pressure from the reaction product to obtain 173 g of a monomer having a repeating unit represented by Formula 1-2 below {yield: 95.9%, NMR: $CH_3$ (1.93, 1.40), $CH_2$ (1.64, 1.36), CH (3.90, 2.03, 2.00, 1.43), H (6.15, 5.58)}.

<Reaction Scheme 2>

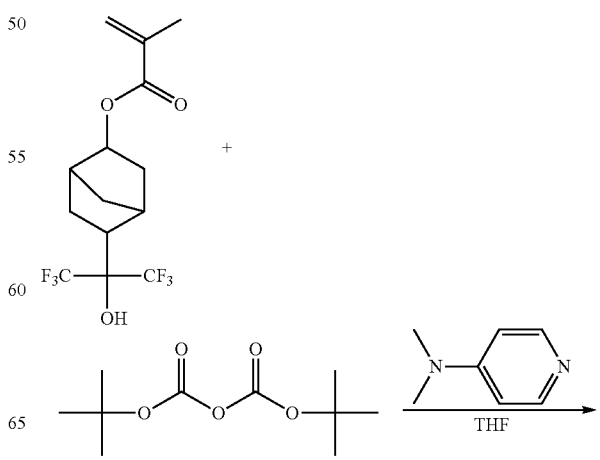

-continued

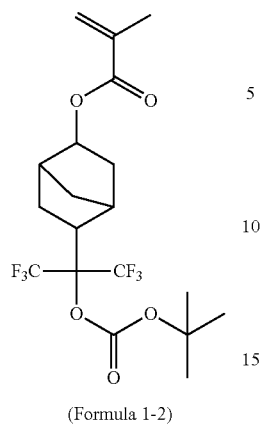

(Formula 1-2)

Preparation Example 3

Preparation of Monomer Having Repeating Unit Represented by Formula 1-3

As illustrated in Reaction Scheme 3 below, to a 2 L three-neck flask were added 140 g (0.389 mol) of a monomer having a hexafluoroalcohol group below and the like, i.e., t-Boc-1,1,1,3,3,3-hexafluoro-norbornane-mathacrylate, 182.84 g (0.821 mol) of di-tert-butyl dicarbonate, 9.30 g (0.075 mol) of DMAP, and 998 g of THF, and the mixture was maintained at room temperature for 20 hours to induce a reaction therebetween. After the reaction was terminated, THF was removed under reduced pressure from the reaction product to obtain 175 g of a monomer having a repeating unit represented by Formula 1-3 below {yield: 97.8%, NMR: $CH_3$ (1.93, 1.40), $CH_2$ (1.64, 1.45, 1.43, 1.36), CH (3.91, 2.03, 1.41), H (6.15, 5.58)}.

-continued

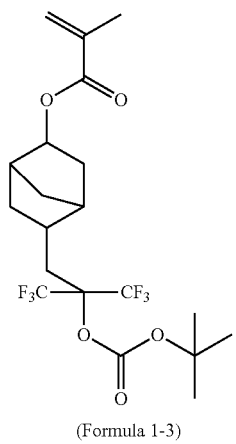

(Formula 1-3)

Preparation Example 4

Preparation of Monomer Having Repeating Unit Represented by Formula 1-9

As illustrated in Reaction Scheme 4 below, to a 2 L three-neck flask were added 150 g (0.297 mol) of a monomer having a hexafluoroalcohol group below and the like, i.e., 3,5-Bis(hexafluoro-2-hydroxy-2-propyl)cyclohexyl-2-fluoroacrylate, 139.98 g (0.629 mol) of di-tert-butyl dicarbonate, 7.12 g (0.057 mol) of DMAP, and 896 g of THF, and the mixture was maintained at room temperature for 20 hours to induce a reaction therebetween. After the reaction was terminated, THF was removed under reduced pressure from the reaction product to obtain 192 g of a monomer having a repeating unit represented by Formula 1-9 below {yield: 91.6%, NMR: $CH_3$ (1.40), $CH_2$ (1.64, 1.36), CH (3.91, 2.01), H (5.41)}.

<Reaction Scheme 3>

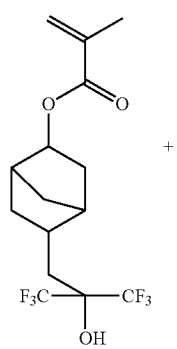

<Reaction Scheme 4>

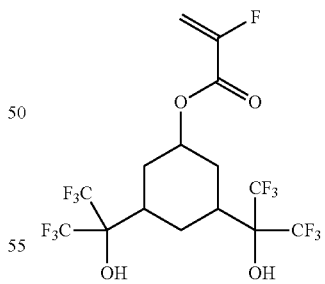

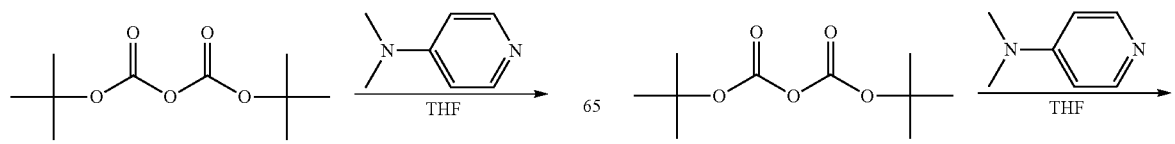

-continued

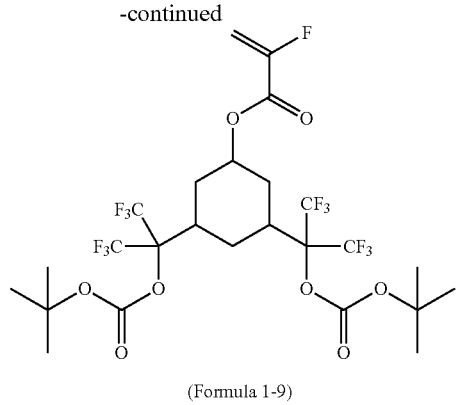

(Formula 1-9)

Example 1

Preparation of Polymer Compound Represented by Formula 6

84.06 g (0.12 mol) of the monomer having a repeating unit of Formula 1-1, 23.53 g (0.24 mol) of the monomer having a repeating unit of Formula 2-1 above, 33.16 g (0.24 mol) of the monomer having a repeating unit of Formula 3-1 above, and 24.63 g of an azobis(isobutyronitrile) (AIBN) initiator were added into a 1,000 ml round-bottom flask and the mixture was dissolved in THF as a solvent. Thereafter, a reaction temperature was maintained at 70° C. and maintained for 12 hours to induce a reaction therebetween. After the reaction was terminated, the reaction product was precipitated in 6,000 ml of heptane, and the precipitate was dried in a vacuum oven at 40° C. for 24 hours. Thereafter, the dried precipitate was dissolved in ether and further precipitated in 5,000 ml of heptane. The reprecipitated polymer was collected and dried in a vacuum oven at 40° C. for 24 hours to obtain 111 g of a polymer compound represented by Formula 6 above (yield: 78.9%, weight average molecular weight (Mw): 8710, PDI (polydispersity index): 2.34).

Example 2

Preparation of Polymer Compound Represented by Formula 7

98 g of a polymer compound (yield: 69.6%, Mw: 9210, PDI: 2.46) was prepared in the same manner as in Example 1, except that 78.12 g (0.175 mol) of the monomer having a repeating unit of Formula 1-2 above, 24.02 g (0.245 mol) of the monomer having a repeating unit of Formula 2-1 above, 38.68 g (0.28 mol) of the monomer having a repeating unit of Formula 3-1 above, and 24.64 g of an AIBN initiator were used instead of the components used in Example 1.

Example 3

Preparation of Polymer Compound Represented by Formula 8

91 g of a polymer compound (yield: 63.5%, Mw: 8864, PDI: 2.32) was prepared in the same manner as in Example 1, except that 80.57 g (0.175 mol) of the monomer having a repeating unit of Formula 1-3 above, 24.02 g (0.245 mol) of the monomer having a repeating unit of Formula 2-1 above, 38.68 g (0.28 mol) of the monomer having a repeating unit of Formula 3-1 above, and 25.07 g of an AIBN initiator were used instead of the components used in Example 1.

Example 4

Preparation of Polymer Compound Represented by Formula 9

102 g of a polymer compound (yield: 70.8%, Mw: 7322, PDI: 2.54) was prepared in the same manner as in Example 1, except that 81.26 g (0.175 mol) of the monomer having a repeating unit of Formula 1-4 above, 24.02 g (0.245 mol) of the monomer having a repeating unit of Formula 2-1 above, 38.68 g (0.28 mol) of the monomer having a repeating unit of Formula 3-1 above, and 25.20 g of an AIBN initiator were used instead of the components used in Example 1.

Example 5

Preparation of Polymer Compound Represented by Formula 10

108 g of a polymer compound (yield: 77.3%, Mw: 9050, PDI: 2.69) was prepared in the same manner as in Example 1, except that 81.26 g (0.175 mol) of the monomer having a repeating unit of Formula 1-5 above, 24.02 g (0.245 mol) of the monomer having a repeating unit of Formula 2-1 above, 38.68 g (0.28 mol) of the monomer having a repeating unit of Formula 3-1 above, and 24.77 g of an AIBN initiator were used instead of the components used in Example 1.

Example 6

Preparation of Polymer Compound Represented by Formula 11

98 g of a polymer compound (yield: 79.9%, Mw: 8850, PDI: 2.31) was prepared in the same manner as in Example 1, except that 75.45 g (0.10 mol) of the monomer having a repeating unit of Formula 1-8 above, 19.61 g (0.20 mol) of the monomer having a repeating unit of Formula 2-1 above, 27.63 g (0.20 mol) of the monomer having a repeating unit of Formula 3-1 above, and 21.47 g of an AIBN initiator were used instead of the components used in Example 1.

Example 7

Preparation of Polymer Compound Represented by Formula 12

114 g of a polymer compound (yield: 79.5%, Mw: 8160, PDI: 2.12) was prepared in the same manner as in Example 1, except that 84.06 g (0.12 mol) of the monomer having a repeating unit of Formula 1-1 above, 17.65 g (0.18 mol) of the monomer having a repeating unit of Formula 2-1 above, 33.16 g (0.24 mol) of the monomer having a repeating unit of Formula 3-1 above, 8.53 g (0.06 mol) of the monomer having a repeating unit of Formula 4-10 above, and 25.1 g of an AIBN initiator were used instead of the components used in Example 1.

Example 8

Preparation of Polymer Compound Represented by Formula 13

72 g of a polymer compound (yield: 51.4%, Mw: 7850, PDI: 2.62) was prepared in the same manner as in Example 1, except that 84.06 g (0.12 mol) of the monomer having a repeating unit of Formula 1-1 above, 17.65 g (0.18 mol) of the monomer having a repeating unit of Formula 2-1 above, 33.16 g (0.24 mol) of the monomer having a repeating unit of Formula 3-1 above, 5.17 g (0.06 mol) of the monomer having a repeating unit of Formula 4-12 above, and 24.51 g of an AIBN initiator were used instead of the components used in Example 1.

Example 9

Preparation of Polymer Compound Represented by Formula 14

95.8 g of a polymer compound (yield: 61.8%, Mw: 8924, PDI: 2.15) was prepared in the same manner as in Example 1, except that 96.32 g (0.138 mol) of the monomer having a repeating unit of Formula 1-1 above, 18.88 g (0.193 mol) of the monomer having a repeating unit of Formula 2-1 above, 32.05 g (0.165 mol) of the monomer having a repeating unit of Formula 3-3 above, 7.82 g (0.055 mol) of the monomer having a repeating unit of Formula 4-10 above, and 27.14 g of an AIBN initiator were used instead of the components used in Example 1.

Example 10

Preparation of Polymer Compound Represented by Formula 15

89.6 g of a polymer compound (yield: 65%, Mw: 7925, PDI: 2.21) was prepared in the same manner as in Example 1, except that 77.06 g (0.11 mol) of the monomer having a repeating unit of Formula 1-1 above, 16.18 g (0.165 mol) of the monomer having a repeating unit of Formula 2-1 above, 32.05 g (0.165 mol) of the monomer having a repeating unit of Formula 3-3 above, 12.56 g (0.11 mol) of the monomer having a repeating unit of Formula 4-6 above, and 24.12 g of an AIBN initiator were used instead of the components used in Example 1.

Example 11

Preparation of Polymer Compound Represented by Formula 16

95.4 g of a polymer compound (yield: 69.5%, Mw: 8672, PDI: 2.14) was prepared in the same manner as in Example 1, except that 92.87 g (0.2 mol) of the monomer having a repeating unit of Formula 1-4 above, 12.26 g (0.125 mol) of the monomer having a repeating unit of Formula 2-1 above, 20.72 g (0.15 mol) of the monomer having a repeating unit of Formula 3-1 above, 11.41 g (0.025 mol) of the monomer having a repeating unit of Formula 5-2 above, and 24.02 g of an AIBN initiator were used instead of the components used in Example 1.

Example 12

Preparation of Polymer Compound Represented by Formula 17

108.5 g of a polymer compound (yield: 77.5%, Mw: 8523, PDI: 2.18) was prepared in the same manner as in Example 1, except that 78.46 g (0.112 mol) of the monomer having a repeating unit of Formula 1-1 above, 16.47 g (0.168 mol) of the monomer having a repeating unit of Formula 2-1 above, 20.89 g (0.151 mol) of the monomer having a repeating unit of Formula 3-1 above, 15.93 g (0.112 mol) of the monomer having a repeating unit of Formula 4-10 above, 8.28 g (0.017 mol) of the monomer having a repeating unit of Formula 5-1 above, and 24.5 g of an AIBN initiator were used instead of the components used in Example 1.

Example 13

Preparation of Polymer Compound Represented by Formula 18

105.6 g of a polymer compound (yield: 73.6%, Mw: 8920, PDI: 2.21) was prepared in the same manner as in Example 1, except that 98.07 g (0.14 mol) of the monomer having a repeating unit of Formula 1-1 above, 9.81 g (0.1 mol) of the monomer having a repeating unit of Formula 2-1 above, 18.65 g (0.135 mol) of the monomer having a repeating unit of Formula 3-1 above, 9.47 g (0.11 mol) of the monomer having a repeating unit of Formula 4-12 above, 7.39 g (0.015 mol) of the monomer having a repeating unit of Formula 5-1 above, and 25.09 g of an AIBN initiator were used instead of the components used in Example 1.

Example 14

Preparation of Polymer Compound Represented by Formula 19

95.5 g of a polymer compound (yield: 65.5%, Mw: 8500, PDI: 2.45) was prepared in the same manner as in Example 1, except that 77.06 g (0.11 mol) of the monomer having a repeating unit of Formula 1-1 above, 16.18 g (0.165 mol) of the monomer having a repeating unit of Formula 2-1 above, 28.85 g (0.149 mol) of the monomer having a repeating unit of Formula 3-3 above, 15.64 g (0.11 mol) of the monomer having a repeating unit of Formula 4-10 above, 8.13 g (0.017 mol) of the monomer having a repeating unit of Formula 5-1 above, and 25.52 g of an AIBN initiator were used instead of the components used in Example 1.

Example 15

Preparation of Polymer Compound Represented by Formula 20

89.6 g of a polymer compound (yield: 64.7%, Mw: 8944, PDI: 2.02) was prepared in the same manner as in Example 1, except that 75.66 g (0.108 mol) of the monomer having a repeating unit of Formula 1-1 above, 15.89 g (0.162 mol) of the monomer having a repeating unit of Formula 2-1 above, 31.47 g (0.162 mol) of the monomer having a repeating unit of Formula 3-3 above, 10.48 g (0.092 mol) of the monomer having a repeating unit of Formula 4-6 above, 8.92 g (0.016 mol) of the monomer having a repeating unit of Formula 5-4 above, and 24.92 g of an AIBN initiator were used instead of the components used in Example 1.

Comparative Example 1

Preparation of Polymer Compound Represented by Formula 21

34.32 g (0.35 mol) of the monomer having a repeating unit of Formula 2-1 above, 20.72 g (0.15 mol) of the monomer having a repeating unit of Formula 3-1 above, and 9.63 g of an AIBN initiator were added into a 500 ml round-bottom flask and the mixture was dissolved in THF as a solvent. Thereafter, a reaction temperature was maintained at 70° C. and maintained for 12 hours to induce a reaction therebetween. After the reaction was terminated, the reaction product was precipitated in 2,500 ml of heptane, and the precipitate was dried in a vacuum oven at 40° C. for 24 hours. Thereafter, the dried precipitate was dissolved in ether and further precipitated in 1,600 ml of heptane. The reprecipitated polymer was collected and dried in a vacuum oven at 40° C. for 24 hours to obtain 36.7 g of a polymer compound represented by Formula 21 below (yield: 66.7%, Mw: 7254, PDI: 2.37).

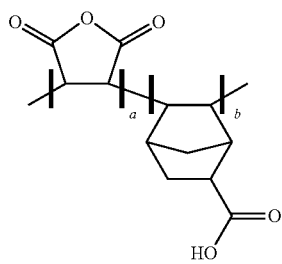

<Formula 21>

Comparative Example 2

Preparation of Polymer Compound Represented by Formula 22

35.8 g of a polymer compound (yield: 57.5%, Mw: 7260, PDI: 2.16) was prepared in the same manner as in Comparative Example 1, except that 15.69 g (0.16 mol) of the monomer having a repeating unit of Formula 2-1 above, 46.62 g (0.24 mol) of the monomer having a repeating unit of Formula 3-3 above, and 10.91 g of an AIBN initiator were used instead of the components used in Comparative Example 1.

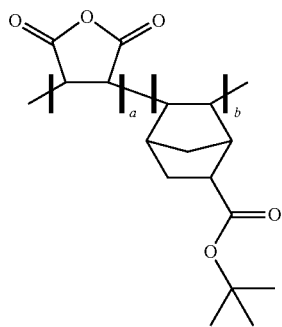

<Formula 22>

Comparative Example 3

Preparation of Polymer Compound Represented by Formula 23

21.8 g of a polymer compound (yield: 49.5%, Mw: 9210, PDI: 2.55) was prepared in the same manner as in Comparative Example 1, except that 54.64 g (0.078 mol) of the monomer having a repeating unit of Formula 1-1 above, 5.1 g (0.052 mol) of the monomer having a repeating unit of Formula 2-1 above, and 10.45 g of an AIBN initiator were used instead of the components used in Comparative Example 1.

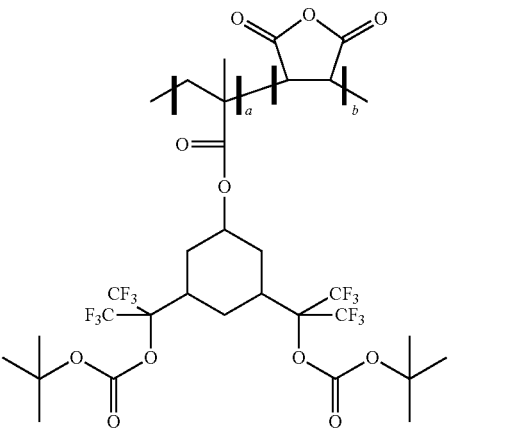

<Formula 23>

Comparative Example 4

Preparation of Polymer Compound Represented by Formula 24

25.7 g of a polymer compound (yield: 53.9%, Mw: 8845, PDI: 2.40) was prepared in the same manner as in Comparative Example 1, except that 50.44 g (0.072 mol) of the monomer having a repeating unit of Formula 1-1 above, 9.32 g (0.048 mol) of the monomer having a repeating unit of Formula 3-3 above, and 10.46 g of an AIBN initiator were used instead of the components used in Comparative Example 1.

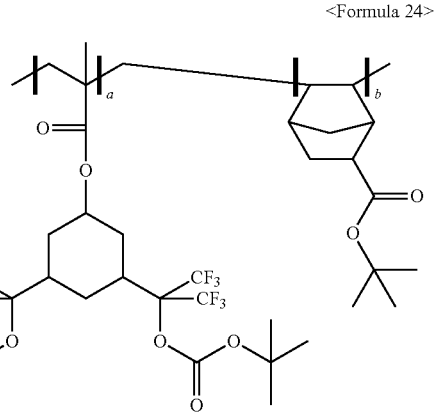

<Formula 24>

Polymerization conditions of the polymer compounds of Examples 1 through 15 and Comparative Examples 1 through 4 are shown in Table 1 below.

TABLE 1

| | Formula of repeating unit of monomer | Ratio of monomers in polymer (parts by mole) | Reaction solvent | yield (%) | MW | PDI |
|---|---|---|---|---|---|---|
| Example 1 | 1-1, 2-1, 3-1 | 20/40/40 | THF | 78.9 | 8710 | 2.34 |
| Example 2 | 1-2, 2-1, 3-1 | 25/35/40 | THF | 69.6 | 9210 | 2.46 |
| Example 3 | 1-3, 2-1, 3-1 | 25/35/40 | THF | 63.5 | 8864 | 2.32 |
| Example 4 | 1-4, 2-1, 3-1 | 25/35/40 | THF | 70.8 | 7322 | 2.54 |
| Example 5 | 1-5, 2-1, 3-1 | 25/35/40 | THF | 76.3 | 9050 | 2.69 |
| Example 6 | 1-8, 2-1, 3-1 | 20/40/40 | THF | 79.9 | 8850 | 2.31 |
| Example 7 | 1-1, 2-1, 3-1, 4-10 | 20/30/40/10 | THF | 79.5 | 8160 | 2.12 |
| Example 8 | 1-1, 2-1, 3-1, 4-12 | 20/30/40/10 | THF | 51.4 | 7850 | 2.62 |
| Example 9 | 1-1, 2-1, 3-3, 4-10 | 25/35/30/10 | THF | 61.8 | 8924 | 2.15 |
| Example 10 | 1-1, 2-1, 3-3, 4-6 | 20/30/30/20 | THF | 65 | 7925 | 2.21 |
| Example 11 | 1-4, 2-1, 3-1, 5-2 | 40/30/5/25 | THF | 69.5 | 8672 | 2.14 |
| Example 12 | 1-1, 2-1, 3-1, 4-10, 5-1 | 20/30/27/20/3 | THF | 77.5 | 8523 | 2.18 |
| Example 13 | 1-1, 2-1, 3-1, 4-12, 5-1 | 28/27/22/20/3 | THF | 73.6 | 8920 | 2.21 |
| Example 14 | 1-1, 2-1, 3-3, 4-10, 5-1 | 20/30/27/20/3 | THF | 65.5 | 8500 | 2.45 |
| Example 15 | 1-1, 2-1, 3-3, 4-6, 5-4 | 20/30/30/17/3 | THF | 64.7 | 8944 | 2.02 |
| Comparative Example 1 | 2-1, 3-1 | 70/30 | THF | 66.7 | 7254 | 2.37 |
| Comparative Example 2 | 2-1, 3-3 | 40/60 | THF | 57.5 | 7260 | 2.16 |
| Comparative Example 3 | 1-1, 2-1 | 40/60 | THF | 49.5 | 9210 | 2.55 |
| Comparative Example 4 | 1-1, 3-3 | 40/60 | THF | 53.9 | 8845 | 2.40 |

Examples 16 Through 34 and Comparative Examples 5 Through 8

Preparation of Resist Protective Film

A photoresist solution (Product Name: DHA-3606, manufactured by DONGJIN SEMICHEM) was coated on a silicon (Si) substrate and the coated Si substrate was baked at 110° C. for 60 seconds to form a resist film (a photoresist layer) having a thickness of 150 nm. A resist protective film-forming composition obtained by dissolving 3 wt % of each of the polymer compounds of Examples 1 through 15 and Comparative Examples 1 through 4 in 97 wt % of a mixed solvent of 4-methyl-2-pentanol and diisoamyl ether (5:5) was spin coated on the resist film and the coated resist film was baked at 90° C. for 60 seconds to form each resist protective film having a thickness of 50 nm.

As an additive used in the resist protective film, dodecyl benzene sulfonic acid was used in Examples 31 and 32, and a mixture of dodecyl benzene sulfonic acid and nonafluorobutanesulfonic acid at a weight ratio of 1:1 was used in Examples 33 and 34.

In particular, the types of polymer compounds used and the amount of the additive are shown in Table 2 below.

Examples 35 Through 37

Preparation of Resist Protective Film

A photoresist solution (Product Name: DHA-3606, manufactured by DONGJIN SEMICHEM) was coated on a Si substrate and the coated Si substrate was baked at 110° C. for 60 seconds to form a resist film (a photoresist layer) having a thickness of 150 nm. A resist protective film-forming composition obtained by dissolving 3 wt % of the polymer compound of Example 9 in 97 wt % of a mixed solvent of 4-methyl-2-pentanol and 1,1-diethoxy propane (7:3) (Example 35), a resist protective film-forming composition obtained by dissolving 3 wt % of the polymer compound of Example 9 in 97 wt % of a mixed solution of diisoamyl ether and 4-hydroxy-4-methyl-2-pentanol (9:1) (Example 36), and a resist protective film-forming composition obtained by dissolving 3 wt % of the polymer compound of Example 14 in 97 wt % of a mixed solvent of diisoamyl ether, 2,6-dimethyl-4-heptanol, and 2-ethyl-1,3-hexanediol (7:2:1) (Example 37) were each spin coated on the resist film, each coated resist film was baked at 90° C. for 60 seconds to form each resist protective film having a thickness of 50 nm.

As an additive used in the resist protective film, dodecyl benzene sulfonic acid was used in Examples 35 through 37.

In particular, the types of polymer compounds used and the amount of the additive are shown in Table 2 below.

Comparative Example 9

A photoresist solution (Product Name: DHA-3606, manufactured by DONGJIN SEMICHEM) was coated on a Si substrate and the coated Si substrate was baked at 110° C. for 60 seconds to form a resist film (photoresist layer) having a thickness of 150 nm. A resist protective film was not formed.

Evaluation of Resist Protective Film (1) Contact Angle Evaluation

To evaluate a contact angle of a resist protective film, a receding contact angle and an advancing contact angle of a wafer with a resist protective film formed thereon were evaluated using a contact angle device (device name: DSA-100, manufacturer: KRUSS) according to a general method disclosed in a paper (Burnett et al., J. Vac. Sci. Techn. B, 23(6), Pages 2721-2727 (November/December 2005)).

(2) Refractive Index Evaluation

A refractive index (n) of each resist protective film was measured at a wavelength of 193 nm by using an ellipsometer (device name: VUV-303, manufacturer: J. A Woollam).

(3) Observation of Change in Thickness of Resist Protective Film

This experiment is perform an immersion lithography process. To observe a change in the thickness of a resist protec tive film before and after the resist protective film was immersed into deionized water, each wafer (substrate) on which the resist protective film was formed was washed with pure water for 1 minute and a change in the thickness of the resist protective film was observed.

(4) Measurement of Change in Line Width of Resist Pattern

To evaluate a change in the line width of a resist pattern after the resist protective film was developed, a change in line width was measured after line and space patterns with resolution of 70 nm were formed.

(5) Measurement of Film Thickness after Developing TMAH

This experiment was performed to evaluate whether the resist protective film was removed after immersion lithography. A resist protective film was formed to a thickness of 100 nm and developed using 2.38% of an aqueous tetramethylammoniumhydroxide (TMAH) solution for 10 seconds and whether the resist protective film was removed was evaluated by measuring the thickness of the resist protective film.

The evaluation results are shown in Table 2 below.

TABLE 2

|  | Polymer compound | Amount of additive (ppm) | Receding contact angle (°) | Advancing contact angle (°) | Refractive index (n) | Change in film thickness before and after DI (nm) | Thickness after development using TMAH (nm) | Change in line width (nm) |
|---|---|---|---|---|---|---|---|---|
| Example 16 | Example 1 | 0 | 74 | 95 | 1.58 | 0 | 0 | 8.2 |
| Example 17 | Example 2 | 0 | 71 | 91 | 1.56 | 0 | 0 | 8.3 |
| Example 18 | Example 3 | 0 | 72 | 93 | 1.57 | 0 | 0 | 8.2 |
| Example 19 | Example 4 | 0 | 72 | 92 | 1.57 | 0 | 0 | 8.5 |
| Example 20 | Example 5 | 0 | 71 | 90 | 1.55 | 0 | 0 | 8.5 |
| Example 21 | Example 6 | 0 | 75 | 95 | 1.59 | 0 | 0 | 8.2 |
| Example 22 | Example 7 | 0 | 79 | 97 | 1.57 | 0 | 0 | 8.4 |
| Example 23 | Example 8 | 0 | 70 | 91 | 1.58 | 0 | 0 | 8.6 |
| Example 24 | Example 9 | 0 | 81 | 98 | 1.57 | 0 | 50 | 8.1 |
| Example 25 | Example 10 | 0 | 78 | 96 | 1.55 | 0 | 0 | 8.5 |
| Example 26 | Example 12 | 0 | 79 | 97 | 1.60 | 0 | 0 | 7.1 |
| Example 27 | Example 13 | 0 | 70 | 91 | 1.61 | 0 | 0 | 7.5 |
| Example 28 | Example 14 | 0 | 81 | 98 | 1.62 | 0 | 40 | 7.2 |
| Example 29 | Example 11 | 0 | 74 | 93 | 1.58 | 0 | 0 | 7.9 |
| Example 30 | Example 15 | 0 | 78 | 96 | 1.55 | 0 | 0 | 7.2 |
| Example 31 | Example 9 | 500 | 81 | 98 | 1.57 | 0 | 0 | 7.2 |
| Example 32 | Example 10 | 500 | 78 | 96 | 1.55 | 0 | 0 | 7.6 |
| Example 33 | Example 12 | 500 | 79 | 97 | 1.60 | 0 | 0 | 7.0 |
| Example 34 | Example 14 | 500 | 81 | 98 | 1.62 | 0 | 0 | 6.8 |
| Example 35 | Example 9 | 500 | 81 | 98 | 1.58 | 0 | 0 | 7.2 |
| Example 36 | Example 9 | 500 | 82 | 98 | 1.56 | 0 | 0 | 7.0 |
| Example 37 | Example 14 | 500 | 80 | 98 | 1.63 | 0 | 0 | 6.9 |
| Comparative Example 5 | Comparative Example 1 | 0 | 52 | 81 | 1.57 | 0 | 80 | — |
| Comparative Example 6 | Comparative Example 2 | 0 | 61 | 88 | 1.58 | 0 | 95 | — |
| Comparative Example 7 | Comparative Example 3 | 0 | 76 | 96 | 1.57 | 0 | 100 | — |
| Comparative Example 8 | Comparative Example 4 | 0 | 79 | 98 | 1.59 | 0 | 100 | — |
| Comparative Example 9 | No resist protective film | No resist protective film to which additive was added | 52 | 80 | 1.69 | No resist protective film, so impossible to evaluate | No resist protective film, so impossible to evaluate | 10.1 |

("—" in change in line width shown in Table 2 indicates that a polymer compound was not dissolved in a solvent and thus it was impossible to perform an experiment)

Referring to Table 2 above, receding contact angles of the resist protective films (Examples 16 through 34) formed using the polymer compounds prepared according to Examples 1 through 14 are 71 to 81°, which is higher than those of the resist protective films (Comparative Examples 5 through 8) formed respectively using the polymer compounds prepared according to Comparative Examples 1 through 4 and advancing contact angles of the resist protective films of Examples 16 through 34 are higher than those of the resist protective films of Comparative Examples 5 through 8, which results in excellent water repellency.

In addition, resist protective films formed of the polymer compounds in which cyclic olefin maleic anhydride is introduced to di-tert-butyl dicarbonate during a developing process after exposure to light exhibit are easily removable, and, when an additive was used, it is confirmed that the removability of the resist protective films further increase. Even when the additive is used, it does not affect contact angles of the resist protective films, which confirms that there are no problems with the resist protective films. It is also confirmed that a photoacid generator (PAG) is bonded to a polymer structure of the resist protective film, thereby reducing line edge roughness (LER) of a pattern shape and, as a result, a resist pattern may be uniformly formed.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A polymer compound comprising: 100 parts by mole of a repeating unit represented by Formula 1; 10 to 900 parts by mole of a repeating unit represented by Formula 2; and 10 to 900 parts by mole of a repeating unit represented by Formula 3, wherein the polymer compound has a weight average molecular weight of 1,000 to 100,000:

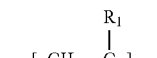

<Formula 1>

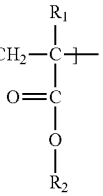

<Formula 2>

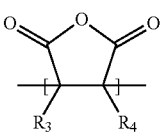

<Formula 3>

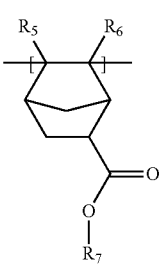

wherein $R_1$, $R_3$, $R_4$, $R_5$, and $R_6$ are each independently a hydrogen atom, a fluorine atom, or a substituted or unsubstituted $C_1$-$C_{20}$ alkyl group, $R_2$ is a substituted or unsubstituted $C_1$-$C_{10}$ alkyl group or a substituted or unsubstituted $C_1$-$C_{10}$ cyclic alkyl group, wherein at least one hydrogen atom of the $C_1$-$C_{10}$ alkyl group and the $C_1$-$C_{10}$ cyclic alkyl group is substituted with a group represented by Formula a, $R_7$ is a hydrogen atom or a substituted or unsubstituted $C_1$-$C_{25}$ alkyl group,

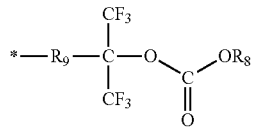

<Formula a> wherein $R_8$ is a hydrogen atom or a substituted or unsubstituted $C_1$-$C_{25}$ alkyl group, $R_9$ is a single bond or a substituted or unsubstituted $C_1$-$C_{10}$ alkylene or cycloalkylene group, and * indicates a binding site.

2. The polymer compound of claim 1, wherein $R_1$, $R_3$, $R_4$, $R_5$, and $R_6$ are each independently a hydrogen atom, a fluorine atom, a methyl group, an ethyl group, a propyl group, a $C_1$-$C_{20}$ alkyl group substituted with at least one fluorine atom, or a $C_1$-$C_{20}$ alkyl group substituted with at least one hydroxyl group, wherein 1 to 4 hydrogen atoms of the $R_2$ is substituted with a group represented by Formula a, $R_7$ is a hydrogen atom, a $C_1$-$C_{25}$ alkyl group substituted with at least one hydroxyl group, or a $C_1$-$C_{25}$ alkyl group substituted with at least one carboxyl group, $R_8$ is a hydrogen atom or a substituted or unsubstituted $C_1$-$C_{10}$ alkyl group, and $R_9$ is a single bond or a substituted or unsubstituted $C_1$-$C_5$ alkylene group.

3. The polymer compound of claim 1, wherein the repeating unit represented by Formula 1 is represented by any one of Formulae 1-1 through 1-18:

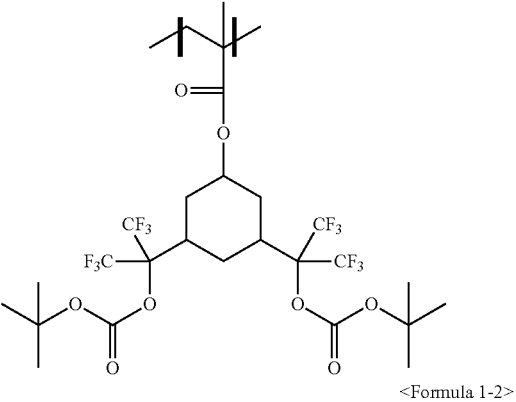

<Formula 1-1>

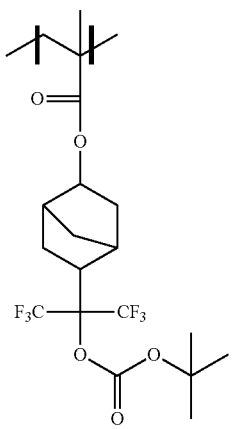

<Formula 1-2>

<Formula 1-3>
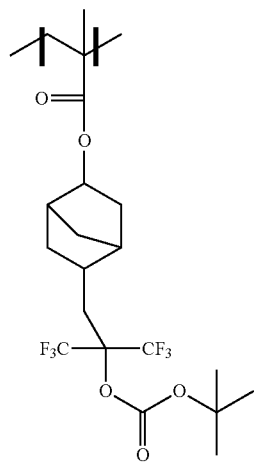
<Formula 1-4>
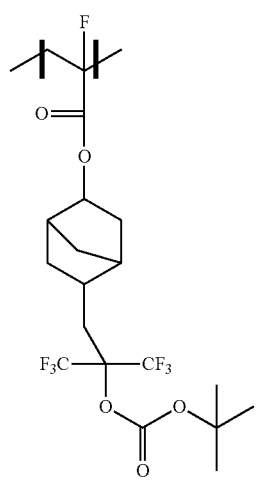
<Formula 1-5>
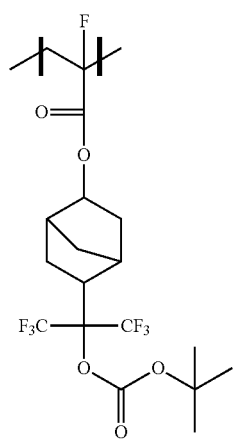
<Formula 1-6>
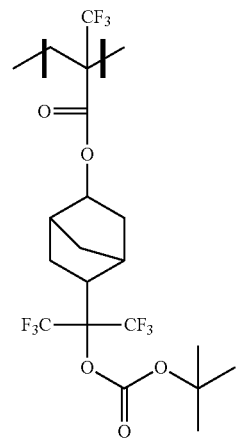
<Formula 1-7>
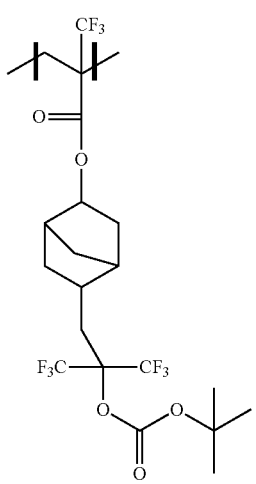
<Formula 1-8>
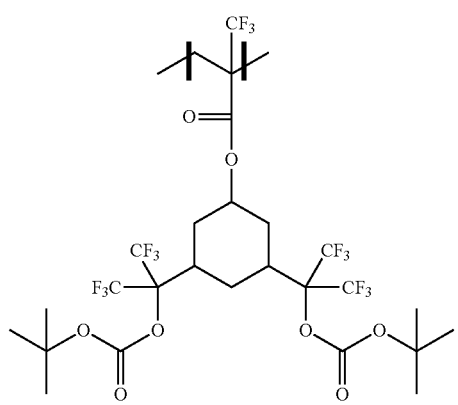

<Formula 1-9>
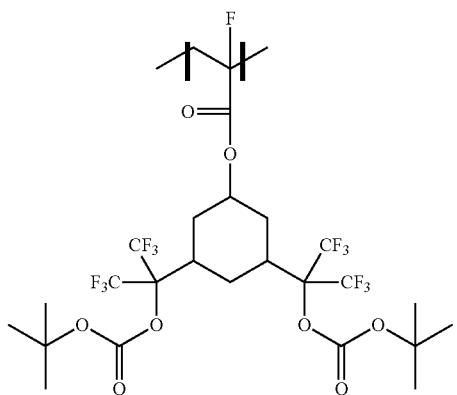
<Formula 1-10>
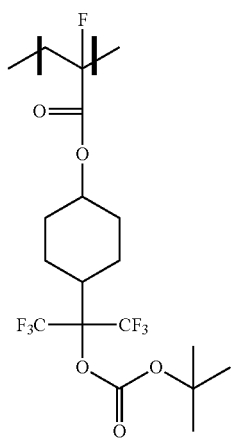
<Formula 1-11>
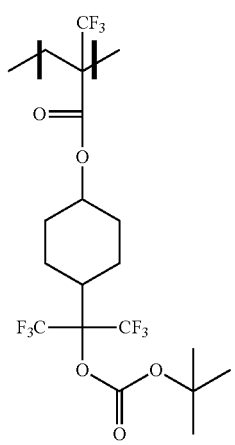
<Formula 1-12>
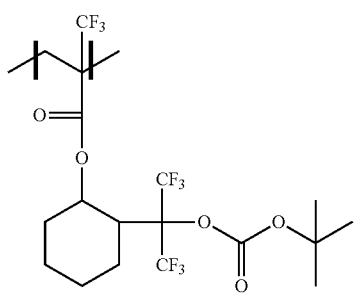
<Formula 1-13>
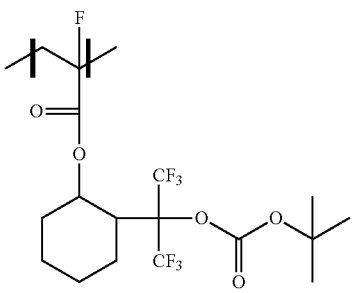
<Formula 1-14>
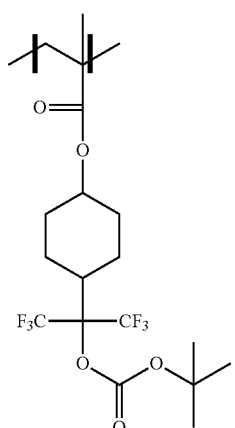
<Formula 1-15>
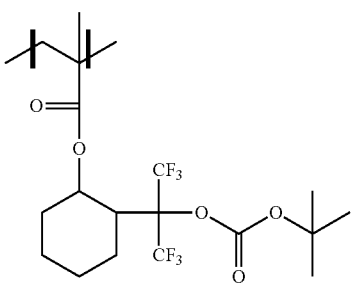
<Formula 1-16>
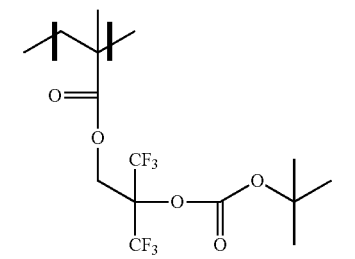
<Formula 1-17>
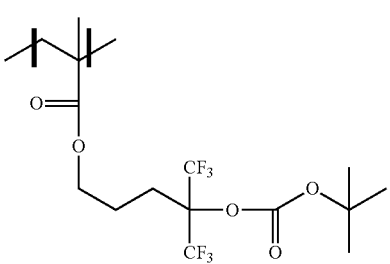

-continued

<Formula 1-18>

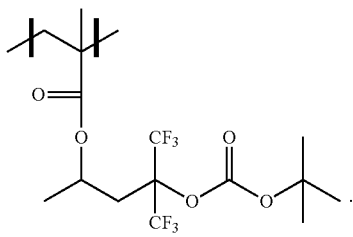

4. The polymer compound of claim 1, wherein the repeating unit represented by Formula 2 is represented by Formula 2-1:

<Formula 2-1>

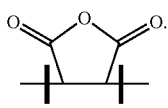

5. The polymer compound of claim 1, wherein the repeating unit represented by Formula 3 is represented by one of Formulae 3-1 through 3-3:

<Formula 3-1>

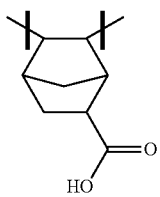

<Formula 3-2>

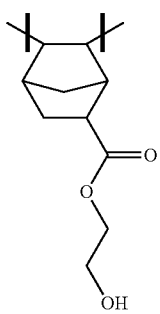

<Formula 3-3>

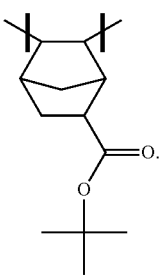

6. The polymer compound of claim 1, further comprising at least one of 10 to 900 parts by mole of a repeating unit represented by Formula 4, 1 to 100 parts by mole of a repeating unit represented by Formula 5, or both at least one of 10 to 900 parts by mole of a repeating unit represented by Formula 4 and 1 to 100 parts by mole of a repeating unit represented by Formula 5:

<Formula 4>

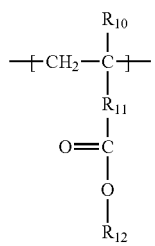

wherein $R_{10}$ is a hydrogen atom, a fluorine atom, or a substituted or unsubstituted $C_1$-$C_{20}$ alkyl group, $R_{11}$ is a substituted or unsubstituted $C_1$-$C_{10}$ alkylene or cycloalkylene group, and $R_{12}$ is a hydrogen atom or a substituted or unsubstituted $C_1$-$C_{25}$ alkyl group, <Formula 5>

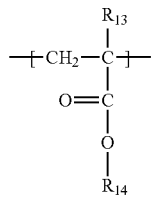

wherein $R_{13}$ is a hydrogen (H) atom, a fluorine (F) atom, or a substituted or unsubstituted $C_1$-$C_{20}$ alkyl group, and $R_{14}$ is represented by Formula b, <Formula b>

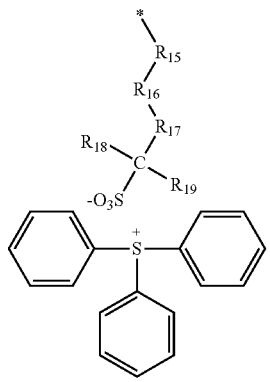

wherein $R_{15}$ and $R_{17}$ are each independently a single bond or a substituted or unsubstituted $C_1$-$C_{10}$ alkylene group, $R_{16}$ is a single bond, —O—, or —COO—, $R_{18}$ and $R_{19}$ are each independently a hydrogen atom, a fluorine atom, or a substituted or unsubstituted $C_1$-$C_{20}$ alkyl group, and * indicates a binding site.

7. The polymer compound of claim 6, wherein $R_{10}$ and $R_{13}$ are each independently a hydrogen atom, a fluorine atom, a methyl group, an ethyl group, a propyl group, a $C_1$-$C_{20}$ alkyl group substituted with at least one fluorine, or a $C_1$-$C_{20}$ alkyl group substituted with at least one hydroxyl group, $R_{12}$ is a hydrogen atom, a $C_1$-$C_{25}$ alkyl group substituted with at least one hydroxyl group, or a $C_1$-$C_{25}$ alkyl group substituted with at least one carboxyl group, $R_{11}$, $R_{15}$, and $R_{17}$ are each independently a single bond or a substituted or unsubstituted $C_1$-$C_5$ alkylene group, $R_{16}$ is —COO—, and $R_{18}$ and $R_{19}$ are each independently a fluorine atom.

8. The polymer compound of claim 6, wherein the repeating unit represented by Formula 4 is represented by Formulae 4-1 through 4-12:

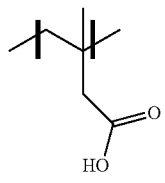
<Formula 4-1>

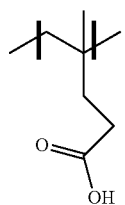
<Formula 4-2>

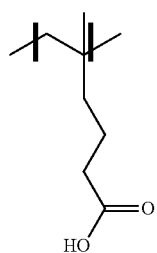
<Formula 4-3>

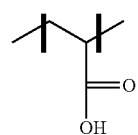
<Formula 4-4>

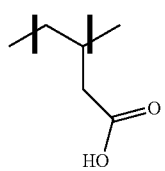
<Formula 4-5>

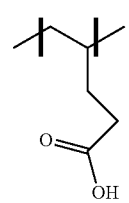
<Formula 4-6>

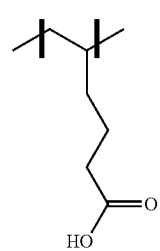
<Formula 4-7>

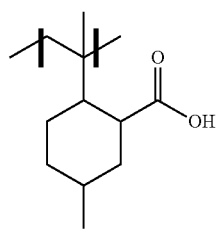
<Formula 4-8>

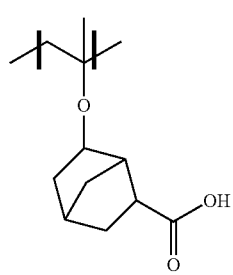
<Formula 4-9>

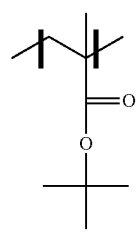
<Formula 4-10>

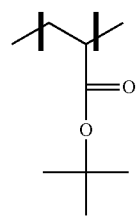
<Formula 4-11>

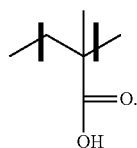
<Formula 4-12>

9. The polymer compound of claim 6, wherein the repeating unit represented by Formula 5 is represented by Formulae 5-1 through 5-11:

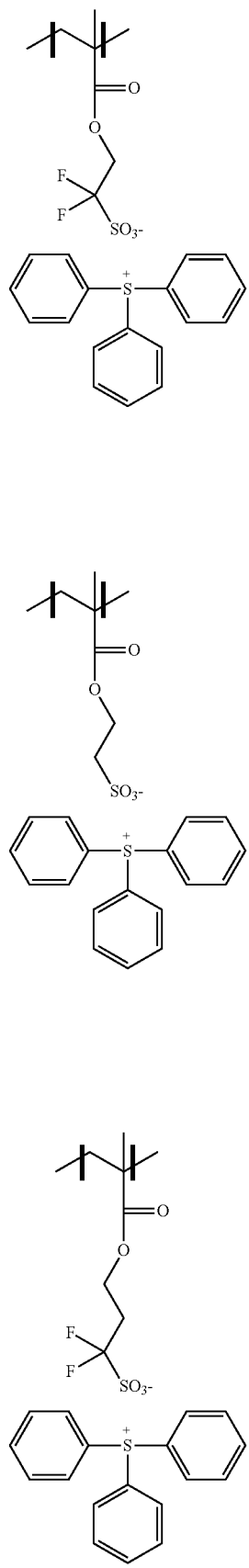
<Formula 5-1>
<Formula 5-2>
<Formula 5-3>
<Formula 5-4>
<Formula 5-5>

<Formula 5-6>
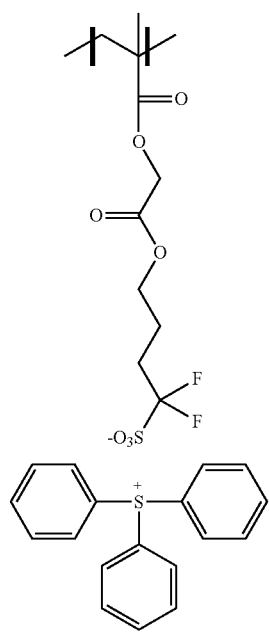
<Formula 5-7>
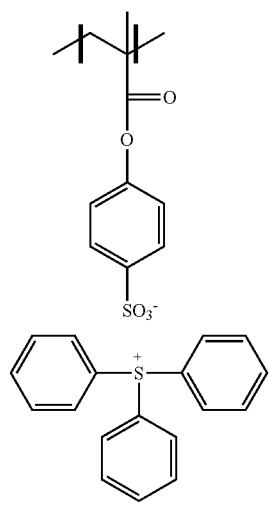
<Formula 5-8>
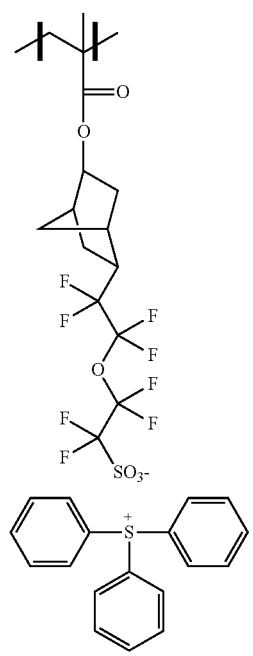
<Formula 5-9>
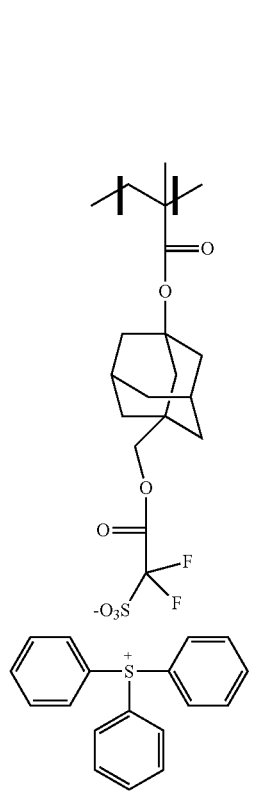

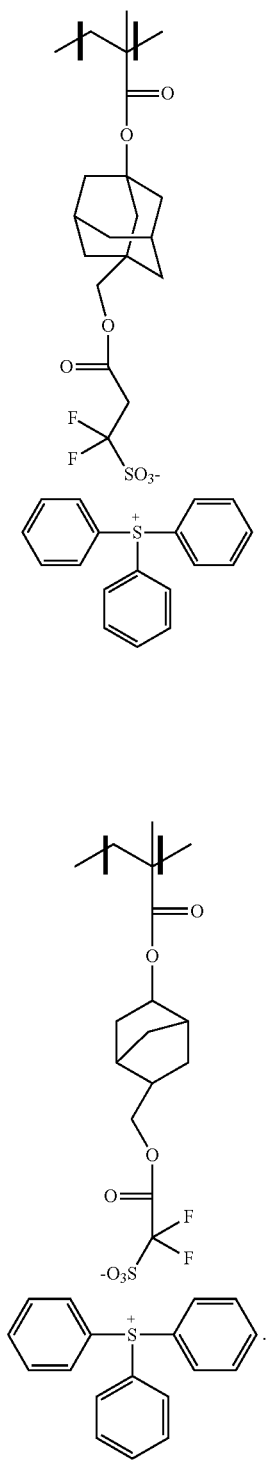
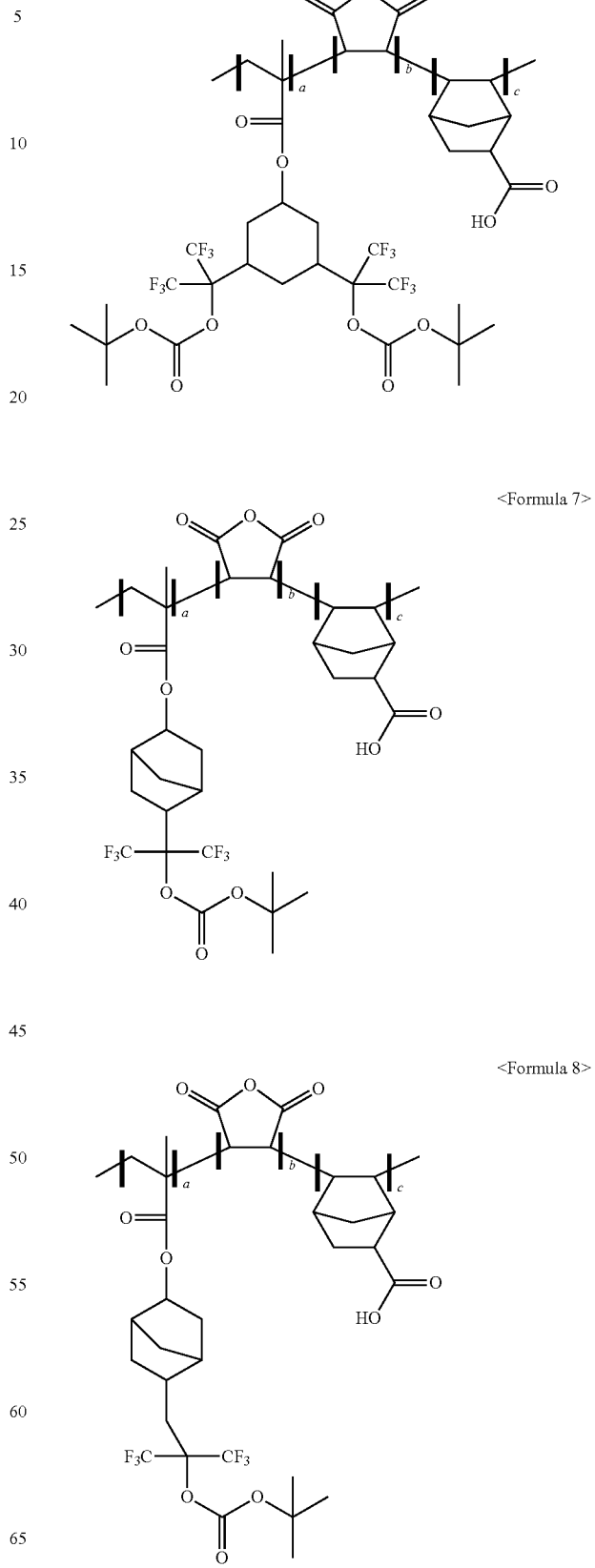
10. The polymer compound of claim 1, wherein the repeating unit is represented by any of Formulae 6 through 11, or a combination of any of Formulae 6 through 11, below:

<Formula 9>
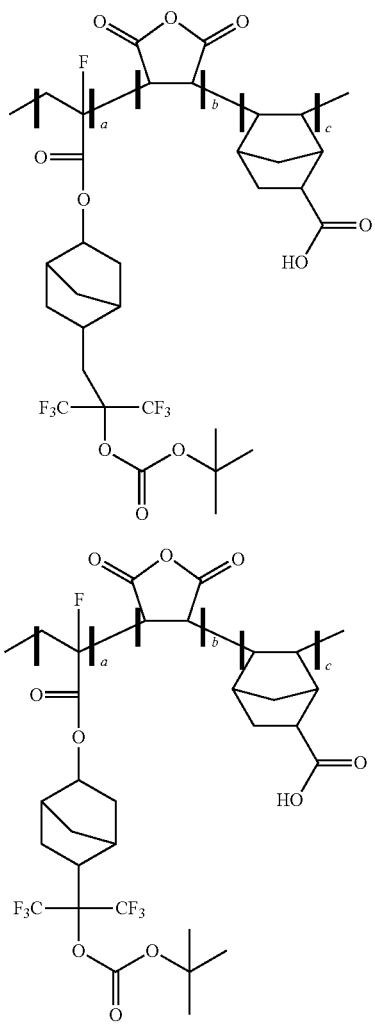
<Formula 10>
<Formula 11>
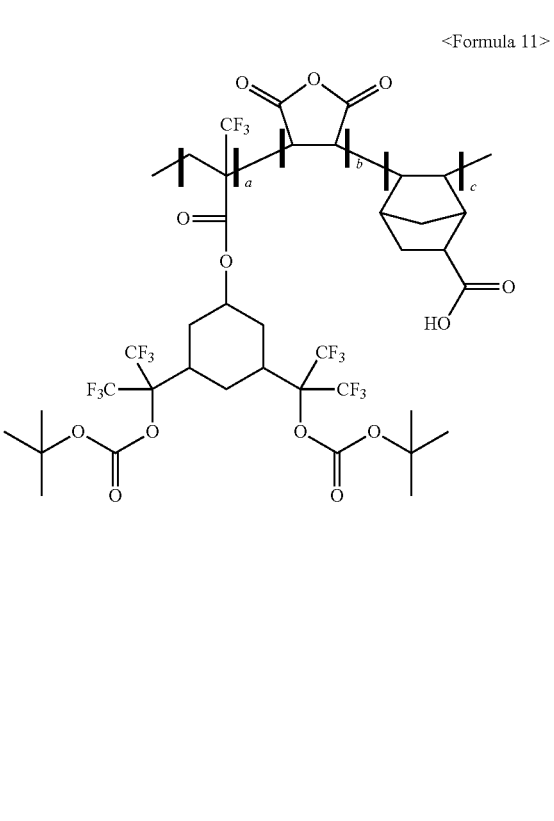
wherein a is 100 parts by mole, b is 10 to 900 parts by mole, and c is 10 to 900 parts by mole.
11. The polymer compound of claim 6, wherein the repeating unit is represented by any of Formulae 12 through 20, or combination of any of Formulae 12 through 20:
<Formula 12>
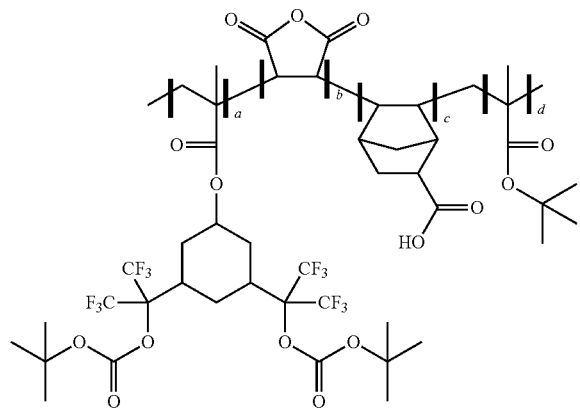
<Formula 13>
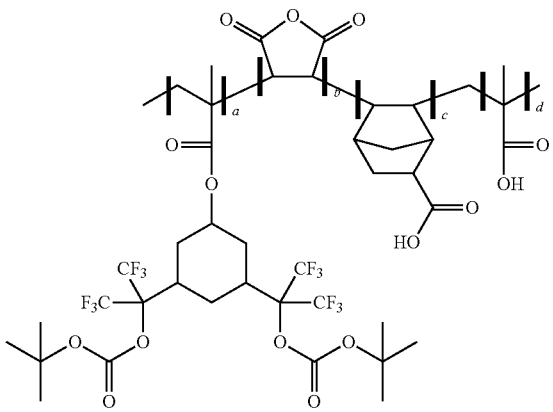

-continued
<Formula 14>
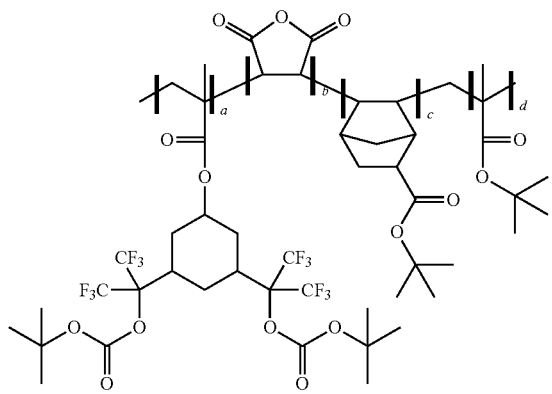
<Formula 15>
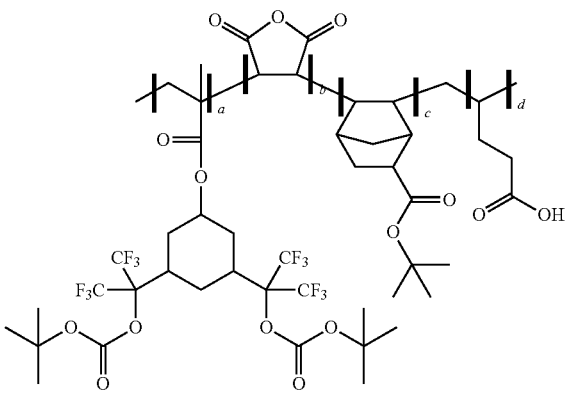
<Formula 16>
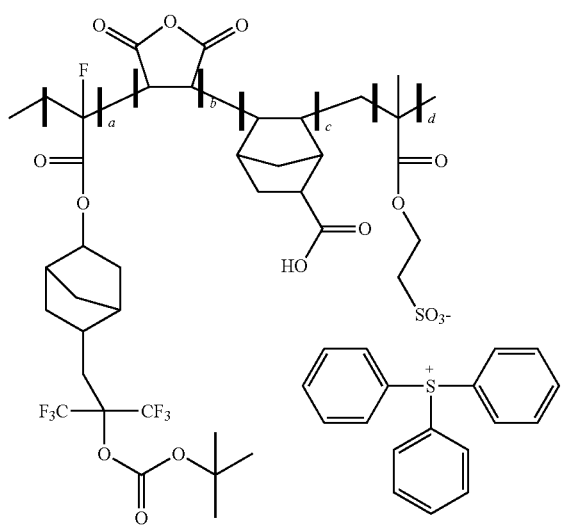
<Formula 17>
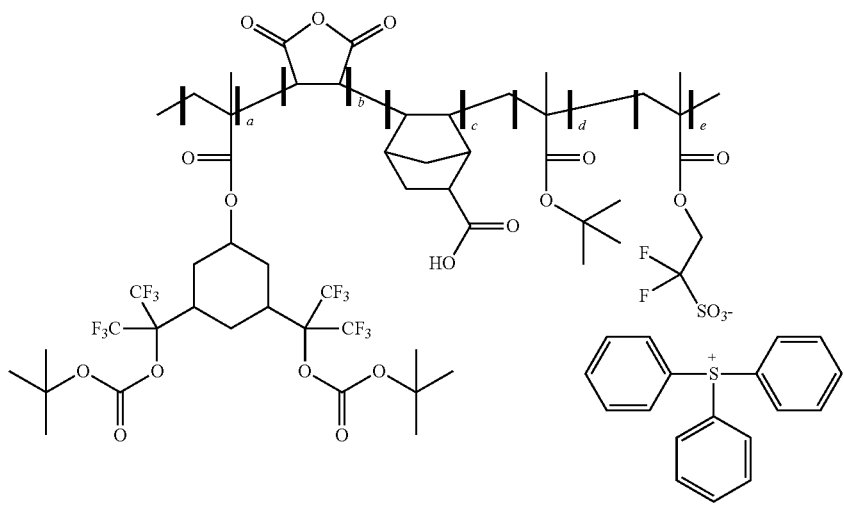

<Formula 18>
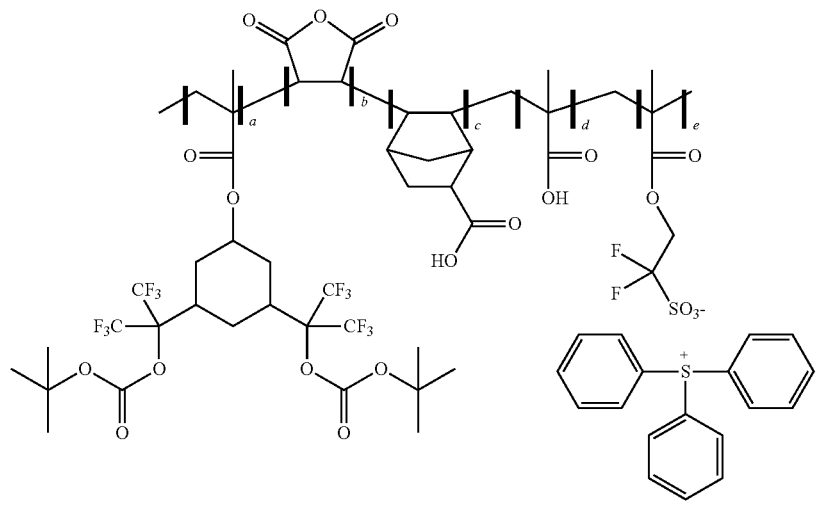
<Formula 19>
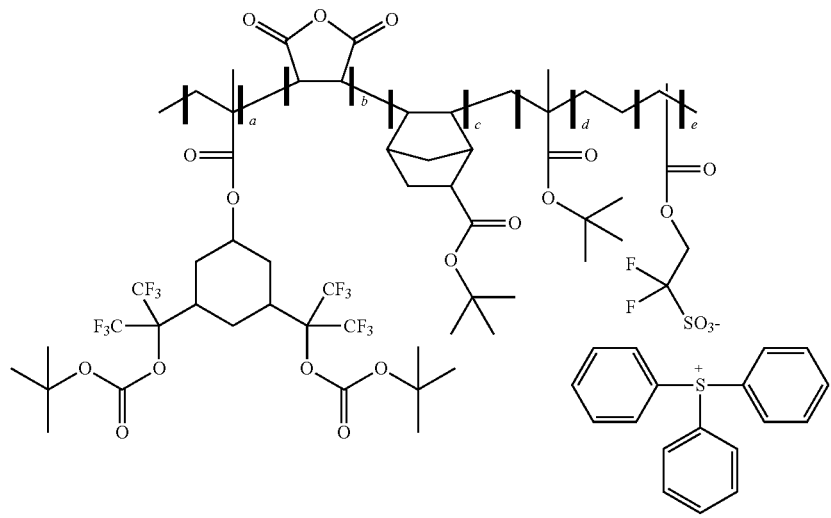
<Formula 20>
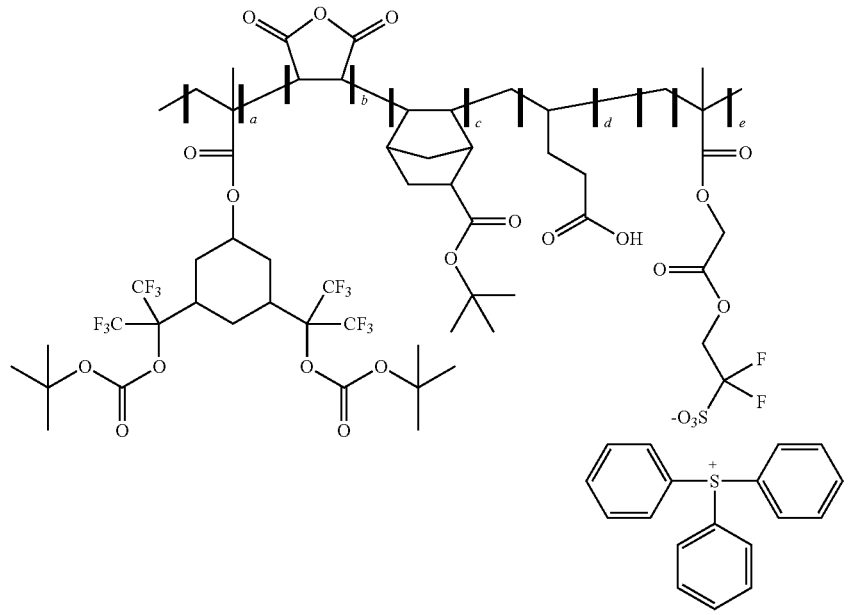

wherein a is 100 parts by mole, b is 10 to 900 parts by mole, c is 10 to 900 parts by mole, d is 10 to 900 parts by mole, and e is 1 to 100 parts by mole.

12. A resist protective film composition for an immersion lithography process, the composition comprising the polymer compound of claim 1 and a solvent.

13. The resist protective film composition of claim 12, wherein an amount of the polymer compound is in a range of 1 to 20 parts by weight based on 100 parts by weight of the solvent.

14. The resist protective film composition of claim 12, wherein the solvent comprises at least one selected from the group consisting of monovalent alcohol, polyol, alkyl ether of polyol, alkyl ether acetate of polyol, ether, cyclic ether, alkane, alkoxy alkane, aromatic hydrocarbon, ketone, ester, and water.

15. The resist protective film composition of claim 14, wherein the monovalent alcohol is a $C_9$-$C_{11}$ monovalent alcohol.

16. The resist protective film composition of claim 14, wherein the polyol is a $C_4$-$C_8$ divalent alcohol.

17. The resist protective film composition of claim 14, wherein the alkoxy alkane is dialkoxy alkane, trialkoxy alkane or tetraalkoxy alkane that includes 3 to 16 carbon atoms.

18. The resist protective film composition of claim 14, wherein the alkoxy alkane comprises at least one selected from the group consisting of dimethoxy methane, diethoxy methane, dibutoxy methane, trimethoxy methane, triethoxy methane, tripropoxy methane, 1,1-diethoxy ethane, 1,2-diethoxy ethane, 1,1-dimethoxy ethane, 1,2-dimethoxy ethane, 1,2-dibutoxy ethane, 1,1,1-trimethoxy ethane, 1,1-diethoxy propane, 2,2-dimethoxy propane, 2,2-diethoxy propane, 1,1-diethoxy isobutane, 1,5-dimethoxy pentane, 1,6-dimethoxy hexane, 1,1-dimethoxy octane, 1,1-dimethoxy dodecane, bis(2-ethoxyethyl)ether, and bis(2-methoxyethyl)ether.

19. The resist protective film composition of claim 12, further comprising a radiation-sensitive acid-generating compound, an acid compound, or both a radiation-sensitive acid-generating compound and an acid compound.

20. The resist protective film composition of claim 19, wherein an amount of the at least one of the radiation-sensitive acid-generating compound and the acid compound is in a range of 0.001 to 10 parts by weight based on 100 parts by weight of the polymer compound.

21. A method of forming a photoresist pattern, the method comprising:
coating a photoresist composition on a substrate to form a photoresist film;
coating the resist protective film composition for an immersion lithography process of claim 12 on the photoresist film to form a resist protective film;
arranging an immersion medium between the resist protective film and a lens; and
irradiating radiation to the photoresist film and the resist protective film via the immersion medium and a mask with a predetermined pattern and developing the irradiated films to form a resist pattern.

* * * * *